US012604622B2

(12) United States Patent
Zhang et al.

(10) Patent No.: US 12,604,622 B2
(45) Date of Patent: Apr. 14, 2026

(54) DISPLAY SUBSTRATE AND DISPLAY DEVICE

(71) Applicant: BOE Technology Group Co., Ltd., Beijing (CN)

(72) Inventors: Ziyu Zhang, Beijing (CN); Fangxu Cao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 428 days.

(21) Appl. No.: 18/032,555

(22) PCT Filed: Mar. 10, 2022

(86) PCT No.: PCT/CN2022/080153
§ 371 (c)(1),
(2) Date: Apr. 18, 2023

(87) PCT Pub. No.: WO2022/262329
PCT Pub. Date: Dec. 22, 2022

(65) Prior Publication Data
US 2023/0389375 A1 Nov. 30, 2023

(30) Foreign Application Priority Data

Jun. 17, 2021 (CN) .......................... 202110671878.8

(51) Int. Cl.
*H10K 59/131* (2023.01)
(52) U.S. Cl.
CPC .................................. *H10K 59/131* (2023.02)
(58) Field of Classification Search
CPC ... H10K 59/873; H10K 59/131; H10K 59/122
See application file for complete search history.

(56) References Cited

U.S. PATENT DOCUMENTS

2021/0257434 A1 8/2021 Xie et al.
2021/0296404 A1* 9/2021 You .................... H10K 59/8792
(Continued)

FOREIGN PATENT DOCUMENTS

CN 1839491 A 9/2006
CN 109935730 A 6/2019
(Continued)

OTHER PUBLICATIONS

First Office Action dated May 16, 2024 for Chinese Patent Application No. 202110671878.8 and English Translation.
(Continued)

*Primary Examiner* — Vongsavanh Sengdara
(74) *Attorney, Agent, or Firm* — Ling Wu; Stephen Yang; Ling and Yang Intellectual Property

(57) ABSTRACT

Provided in the present disclosure are a display substrate and a display device. The display substrate includes a display area and a frame area located on at least one side of the display area, and the display area and the frame area include at least one stretching hole; the stretching hole includes a hole area and a partition area, which surrounds the stretching hole, the partition area being provided with a first partition structure surrounding the hole area; and the first partition structure includes a first partition layer, which surrounds the hole area, and a first inorganic layer, which is arranged on the first partition layer, the first partition layer is provided with a partition slot surrounding the hole area, the first inorganic layer is provided with a partition hole surrounding the hole area, and the partition hole is in communication with the partition slot.

19 Claims, 18 Drawing Sheets

(56)                    References Cited

U.S. PATENT DOCUMENTS

| | | | |
|---|---|---|---|
| 2022/0115474 A1* | 4/2022 | Jia ........................ | H10K 59/124 |
| 2023/0255074 A1 | 8/2023 | Yu et al. | |
| 2024/0023408 A1* | 1/2024 | Zhang ................. | H10K 59/873 |

FOREIGN PATENT DOCUMENTS

| | | | |
|---|---|---|---|
| CN | 110416282 A | 11/2019 |
| CN | 111370454 A | 7/2020 |
| CN | 111525047 A | 8/2020 |
| CN | 111564482 A | 8/2020 |
| CN | 111653595 A | 9/2020 |
| CN | 112271196 A | 1/2021 |
| CN | 113241422 A | 8/2021 |
| CN | 215933640 U | 3/2022 |
| JP | 2009036859 A | 2/2009 |

OTHER PUBLICATIONS

International Search Report for PCT/CN2022/080153 Mailed May 24, 2022.

* cited by examiner

DISPLAY SUBSTRATE AND DISPLAY DEVICE

CROSS-REFERENCE TO RELATED APPLICATIONS

The present application is a U.S. National Phase Entry of International Application No. PCT/CN2022/080153 having an international filing date of Mar. 10, 2022, which claims the priority of Chinese Patent Application No. 202110671878.8, filed to the CNIPA on Jun. 17, 2021 and entitled "Display Substrate and Display Device". The above-identified applications are hereby incorporated by reference.

TECHNICAL FIELD

The present disclosure relates to, but is not limited to, the field of display technology, in particular to a display substrate and a display device.

BACKGROUND

An Organic Light Emitting Diode (OLED for short) is an active light emitting display device, which has advantages of auto-luminescence, a wide viewing angle, a high contrast ratio, low power consumption, an extremely high response speed, lightness and thinness, bendability, and a low cost, etc. With constant development of display technologies, a flexible display device (Flexible Display) using an OLED as a light emitting device and performing signal control using a Thin Film Transistor (TFT for short) has become a mainstream product in the field of display at present.

SUMMARY

The following is a summary of subject matters described herein in detail. The summary is not intended to limit the protection scope of claims.

In one aspect, the present disclosure provides a display substrate including a display region and a bezel region located on at least one side of the display region, both of the display region and the bezel region include at least one stretch hole; the stretch hole includes a hole region and a partition region surrounding the stretch hole, the partition region is provided with a first partition structure surrounding the hole region; the first partition structure includes a first partition layer surrounding the hole region and a first cover layer provided on the first partition layer, a partition groove surrounding the hole region is provided on the first partition layer, a partition hole surrounding the hole region is provided on the first cover layer, and the partition hole is communicated with the partition groove; the first cover layer located at the periphery of the partition hole has a protrusion relative to the side wall of the partition groove, and the protrusion and the side wall of the partition groove form a recessed structure.

In an exemplary implementation mode, the bezel region includes a circuit region, a power supply line region and an edge region provided sequentially along a direction away from the display region, the power supply line region includes at least one stretch hole; in a plane perpendicular to the base substrate, the power supply line region includes at least one insulation layer disposed on the base substrate and a power supply line disposed on the at least one insulation layer; the first partition layer in the first partition structure covers the edge of the hole region of the power supply line on the side close to the hole region.

In an exemplary implementation mode, the first cover layer is not in direct contact with the power supply line.

In an exemplary implementation mode, the first cover layer of the first partition structure on the side away from the hole region is lapped on the power supply line.

In an exemplary implementation mode, the orthographic projection of the power supply line on the plane of the display substrate and the orthographic projection of the first cover layer on the plane of the display substrate at most partially overlap.

In an exemplary implementation mode, in a plane parallel to the base substrate, a first edge and/or a second edge of the power supply line are bending lines, the first edge is an edge of the power supply line on the side away from the display region, and the second edge is an edge of the power supply line on the side close to the display region.

In an exemplary implementation mode, the orthographic projection of the first edge and/or the second edge on the plane of the display substrate does not overlap the orthographic projection of the stretch hole on the plane of the display substrate.

In an exemplary implementation mode, a second partition structure is provided on the side of the first edge away from the display region, the second partition structure includes a second partition layer extending along the first edge and a second cover layer disposed on the second partition layer, a partition groove extending along the first edge is provided on the second partition layer, and a partition hole extending along the first edge is provided on the second cover layer, and the partition hole is communicated with the partition groove; the second cover layer located at the periphery of the partition hole has a protrusion relative to the side wall of the partition groove, and the protrusion and the side wall of the partition groove form a recessed structure.

In an exemplary implementation mode, the second partition layer in the second partition structure covers the first edge of the power supply line.

In an exemplary implementation mode, the second cover layer is not in direct contact with the power supply line.

In an exemplary implementation mode, the second cover layer on the side of the second partition structure close to the display region is lapped on the power supply line.

In an exemplary implementation mode, the power supply line region further includes a connection electrode and a first partition dam surrounding the hole region, the connection electrode is disposed on the power supply line, the first partition dam is disposed on the side of the first partition structure away from the hole region, and a side of the first partition dam away from the hole region covers an edge of the connection electrode on the side close to the hole region.

In an exemplary implementation mode, the power supply line region further includes a connection electrode and a second partition dam extending along the first edge, the second partition dam is disposed on the side of the second partition structure close to the display region, and a side of the second partition dam close to the display region covers an edge of the connection electrode on the side close to the first edge.

In an exemplary implementation mode, the display substrate further includes a third cover layer disposed over the first cover layer and/or the second cover layer, the third cover layer covers at least the first cover layer and/or the second cover layer, and the partition groove.

In an exemplary implementation mode, an edge of the first cover layer away from the hole region and an edge of the third cover layer away from the hole region are substantially flush; and/or an edge of the second cover layer away from the hole region and an edge of the third cover layer away from the hole region are substantially flush.

In an exemplary implementation mode, the power supply line region further includes a connection electrode, the connection electrode is provided on the power supply line, a side of the connection electrode close to the hole region covers an edge of the first cover layer on which the power supply line is lapped on, and a side of the connection electrode close to the first edge covers an edge of the first cover layer on which the power supply line is lapped on.

In an exemplary implementation mode, the power supply line region further includes a first partition dam surrounding the hole region, the first partition dam is disposed on the side of the first partition structure away from the hole region, a side of the first partition dam close to the hole region is disposed on the first cover layer, and a side of the first partition dam away from the hole region covers an edge of the connection electrode on the side close to the hole region.

In an exemplary implementation mode, the orthographic projection of an edge of the connection electrode on the side close to the hole region on the plane of the display substrate is within the range of the orthographic projection of the first partition dam on the plane of the display substrate, and/or, the orthographic projection of an edge of the first cover layer on the side away from the hole region on the plane of the display substrate is within the range of the orthographic projection of the first partition dam on the plane of the display substrate.

In an exemplary implementation mode, the power supply line region further includes a second partition dam extending along the first edge, the second partition dam is disposed on the side of the second partition structure close to the display region, a side of the second partition dam away from the display region is disposed on the second cover layer, and a side of the second partition dam close to the display region covers an edge of the connection electrode on the side close to the first edge.

In an exemplary implementation mode, the orthographic projection of an edge of the connection electrode on the side away from the display region on the plane of the display substrate is within the range of the orthographic projection of the second partition dam on the plane of the display substrate, and/or, the orthographic projection of an edge of the second cover layer on the side close to the display region on the plane of the display substrate is within the range of the orthographic projection of the second partition dam on the plane of the display substrate.

In an exemplary implementation mode, the orthographic projection of the connection electrode on the plane of the display substrate and the orthographic projection of the first cover layer on the plane of the display substrate have at least a first portion of overlap; the orthographic projection of the connection electrode on the plane of the display substrate and the orthographic projection of the second cover layer on the plane of the display substrate have at least a second portion of overlap.

In an exemplary implementation mode, the first portion of overlap is within the range of the orthographic projection of the first partition dam on the plane of the display substrate and the second portion of overlap is within the range of the orthographic projection of the second partition dam on the plane of the display substrate.

In an exemplary implementation mode, the power supply line region further includes a cathode disposed on the connection electrode and covering the first partition dam and second partition dam.

In an exemplary implementation mode, the display region includes a drive circuit layer disposed on the base substrate and a light emitting structure layer disposed on the drive circuit layer; the first partition layer and the second partition layer are provided on the same layer as a planarization layer in the drive circuit layer, and the first partition dam and the second partition dam are provided on the same layer as a pixel definition layer in the light emitting structure layer.

In another aspect, in the present disclosure a display device is further provided, including the aforementioned display substrate.

Other aspects may be understood upon reading and understanding the drawings and detailed description.

BRIEF DESCRIPTION OF DRAWINGS

Accompanying drawings are used for providing further understanding for the technical solutions of the present disclosure, constitute a part of the specification, and together with the embodiments of the present disclosure, are used for explaining the technical solutions of the present disclosure but not to constitute limitations on the technical solutions of the present disclosure. Shapes and sizes of various components in the drawings do not reflect actual scales, but are only intended to schematically illustrate contents of the present disclosure.

Figure 1:
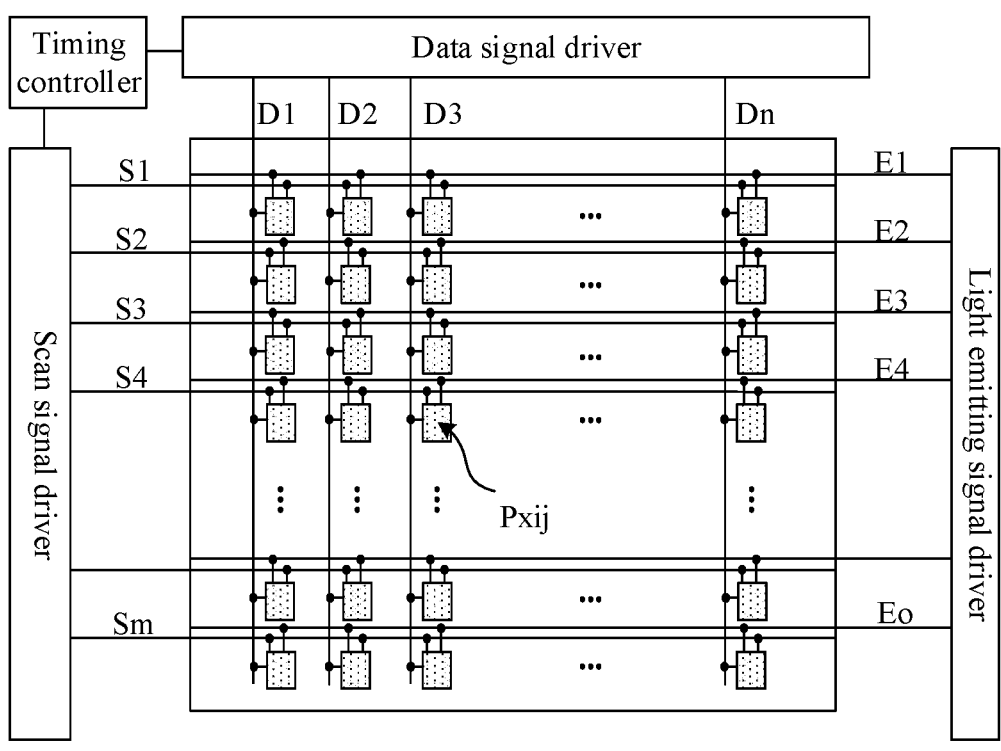
FIG. 1 is a schematic diagram of a structure of a display substrate.

disclosure is not necessarily limited to the sizes, and shapes and sizes of various components in the drawings do not reflect actual scales. In addition, the drawings schematically illustrate ideal examples, and one implementation of the present disclosure is not limited to the shapes, numerical values, or the like shown in the drawings.

Ordinal numerals such as "first", "second", and "third" in the specification are set to avoid confusion of constituent elements, but not to set a limit in quantity.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the Description of reference signs:

| | | |
|---|---|---|
| 1-glass carrier plate; | 10-base substrate; | 11-first active layer; |
| 12-first gate electrode; | 13-first source electrode; | 14-first drain electrode; |
| 21-second active layer; | 22-second gate electrode; | 23-second source electrode; |
| 24-second drain electrode; | 31-first capacitor electrode; | 32- third capacitor electrode; |
| 41-second capacitor electrode; | 42- fourth capacitor electrode; | 50-hole region; |
| 51-partition region; | 60-first partition layer; | 61-partition groove; |
| 70-second partition layer; | 71-anode; | 72-connection electrode; |
| 73-pixel definition layer; | 74- first partition dam; | 75- second partition dam; |
| 76-organic light emitting layer; | 77-cathode; | 78-optical coupling layer; |
| 81-first encapsulation layer; | 82-second encapsulation layer; | 83-third encapsulation layer; |
| 91-first insulation layer; | 92-second insulation layer; | 93-third insulation layer; |
| 94-fourth insulation layer; | 95-planarization layer; | 96-First inorganic layer; |
| 97-Second inorganic layer; | 98- third inorganic layer; | 100-display region; |
| 101-first transistor; | 102-first storage capacitor; | 200-bonding region; |
| 201-second transistor; | 202-second storage capacitor; | 300-bezel region; |
| 301-circuit region; | 302-power supply line region; | 303- edge region |
| 310-power supply line; | 311-first edge; | 312-second edge; |
| 313-edge of hole region; | 500-stretch hole. | |

DETAILED DESCRIPTION

To make objectives, technical solutions, and advantages of the present disclosure clearer, the embodiments of the present disclosure will be described in detail with reference to the accompanying drawings. It is to be noted that implementations may be implemented in a plurality of different forms. Those of ordinary skills in the art may easily understand such a fact that implementations and contents may be transformed into various forms without departing from the purpose and scope of the present disclosure. Therefore, the present disclosure should not be explained as being limited to contents described in following implementations only. The embodiments in the present disclosure and features in the embodiments may be combined randomly with each other if there is no conflict. In order to keep following description of the embodiments of the present disclosure clear and concise, detailed descriptions about part of known functions and known components are omitted in the present disclosure. The drawings of the embodiments of the present disclosure only involve structures involved in the embodiments of the present disclosure, and other structures may refer to usual designs.

In the drawings, a size of various constituent element, a thickness of a layer, or a region is exaggerated sometimes for clarity. Therefore, one implementation mode of the present constituent elements may be changed as appropriate according to directions for describing the various constituent elements. Therefore, appropriate replacements may be made according to situations without being limited to the wordings described in the specification.

In the specification, unless otherwise specified and defined explicitly, terms "mount", "mutually connect", and "connect" should be understood in a broad sense. For example, the connection may be a fixed connection, a detachable connection or an integrated connection. It may be a mechanical connection or an electrical connection. It may be a direct mutual connection, or an indirect connection through middleware, or internal communication between two components. Those of ordinary skill in the art may understand specific meanings of these terms in the present disclosure according to specific situations.

In the specification, a transistor refers to a component which includes at least three terminals, i.e., a gate electrode, a drain electrode and a source electrode. The transistor has a channel region between the drain electrode (drain electrode terminal, drain region, or drain) and the source electrode (source electrode terminal, source region, or source), and a current may flow through the drain electrode, the channel region, and the source electrode. It is to be noted that, in the specification, the channel region refers to a region through which the current mainly flows.

In the specification, a first electrode may be a drain electrode, and a second electrode may be a source electrode. Or, the first electrode may be the source electrode, and the second electrode may be the drain electrode. In cases that transistors with opposite polarities are used, a current direction changes during operation of a circuit, or the like, functions of the "source electrode" and the "drain electrode" are sometimes interchangeable. Therefore, the "source electrode" and the "drain electrode" are interchangeable in the specification.

In the specification, "electrical connection" includes a case that constituent elements are connected together through an element with a certain electrical effect. The "element with the certain electrical effect" is not particularly limited as long as electrical signals may be sent and received between the connected constituent elements. Examples of the "element with the certain electrical effect" not only include electrodes and wirings, but also include switch elements such as transistors, resistors, inductors, capacitors, other elements with various functions, etc.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

In the specification, a "film" and a "layer" are interchangeable. For example, a "conductive layer" may be replaced with a "conductive film" sometimes. Similarly, an "insulating film" may be replaced with an "insulation layer" sometimes.

In the present disclosure, "about" refers to that a boundary is defined not so strictly and numerical values within process and measurement error ranges are allowed.

FIG. 1 is a schematic diagram of a structure of a display device. As shown in FIG. 1, an OLED display device may include a timing controller, a data signal driver, a scan signal driver, a light emitting signal driver, and a pixel array. The pixel array may include a plurality of scan signal lines (S1 to Sm), a plurality of data signal lines (D1 to Dn), a plurality of light emitting signal lines (E1 to Eo), and a plurality of sub-pixels Pxij. In an exemplary implementation, the timing controller may provide the data signal driver with a gray-scale value and a control signal suitable for a specification of the data signal driver, may provide the scan signal driver with a clock signal, a scan starting signal, etc., suitable for a specification of the scan signal driver, and may provide the light emitting signal driver with a clock signal, an emission stopping signal, etc., suitable for a specification of the light emitting signal driver. The data driver may generate a data voltage to be provided to the data signal lines D1, D2, D3 and Dn by using the gray scale value and the control signal that are received from the timing controller. For example, the data signal driver may sample the gray scale value using a clock signal and apply a data voltage corresponding to the gray scale value to the data signal lines D1 to Dn by taking a pixel row as a unit, wherein n may be a natural number. The scan signal driver may receive the clock signal, the scan start signal and the like from the timing controller to generate a scan signal to be provided to the scan signal lines S1, S2, S3 . . . and Sm. For example, the scan signal driver may sequentially provide a scan signal with an on-level pulse to the scan signal lines S1 to Sm. For example, the scan signal driver may be constructed in a form of a shift register and generate a scan signal in a manner of sequentially transmitting a scan start signal provided in a form of an on-level pulse to a next-stage circuit under control of the clock signal, wherein m may be a natural number. The light emitting driver may receive the clock signal, the emission stop signal and the like from the timing controller to generate an emission signal to be provided to the light emitting signal lines E1, E2, E3 . . . and Eo. For example, the light emitting signal driver may sequentially provide an emission signal with an off-level pulse to the light emitting signal lines E1 to Eo. For example, the light emitting signal driver may be constructed in a form of a shift register and generate a light emitting signal in a manner of sequentially transmitting a light emitting stop signal provided in a form of an off-level pulse to a next-stage circuit under control of a clock signal, wherein o may be a natural number. The pixel array may include a plurality of sub-pixels Pxij. Each sub-pixel Pxij may be connected to the corresponding data signal line, the corresponding scanning signal line, and the corresponding light emitting signal line. Herein, i and j may be natural numbers. The sub-pixel Pxij may refer to a sub-pixel in which a transistor is connected to an i-th scan signal line and connected to a j-th data signal line.

Figure 2:
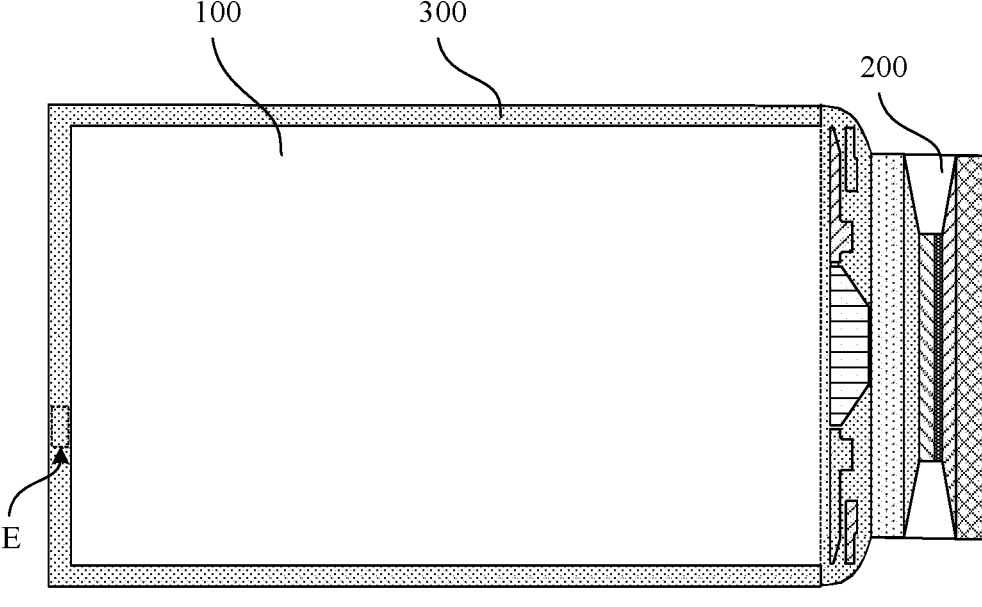
FIG. 2 is a schematic diagram of a structure of a display substrate.

FIG. 2 is a schematic diagram of a structure of a display substrate. As shown in FIG. 2, in an exemplary implementation mode, the display substrate includes a display region 100, a bonding region 200 located on a side of the display region 100, and a bezel region 300 located on an other side of the display region 100. The display region 100 may include a plurality of sub-pixels arranged regularly, the sub-pixel may include a pixel drive circuit and a light emitting device, the bonding region 200 may include a bonding circuit connecting signal lines to an external drive device, and the bezel region 300 may include a gate drive circuit and a second power supply line VS S for transmitting voltage signals to the plurality of sub-pixels.

At present, a flexible OLED display device is uniaxially bent, and an amount of screen deformation is small. By opening a micro-hole on a display substrate, tensile performance of the display substrate may be improved. An island bridge structure may be adopted for a flexible display substrate, in the island bridge structure, a light emitting device is disposed in a pixel island region, a hole region including a micro-hole is disposed between pixel islands, and a connection line is disposed in a connection bridge region between the pixel islands and between hole regions. When applying an external force to stretch the display substrate, deformation mainly occurs in the hole region and the connection bridge region, and the light emitting device in the pixel region basically maintains a shape, which may ensure that the light emitting device in the pixel island region will not be damaged.

Figure 3:
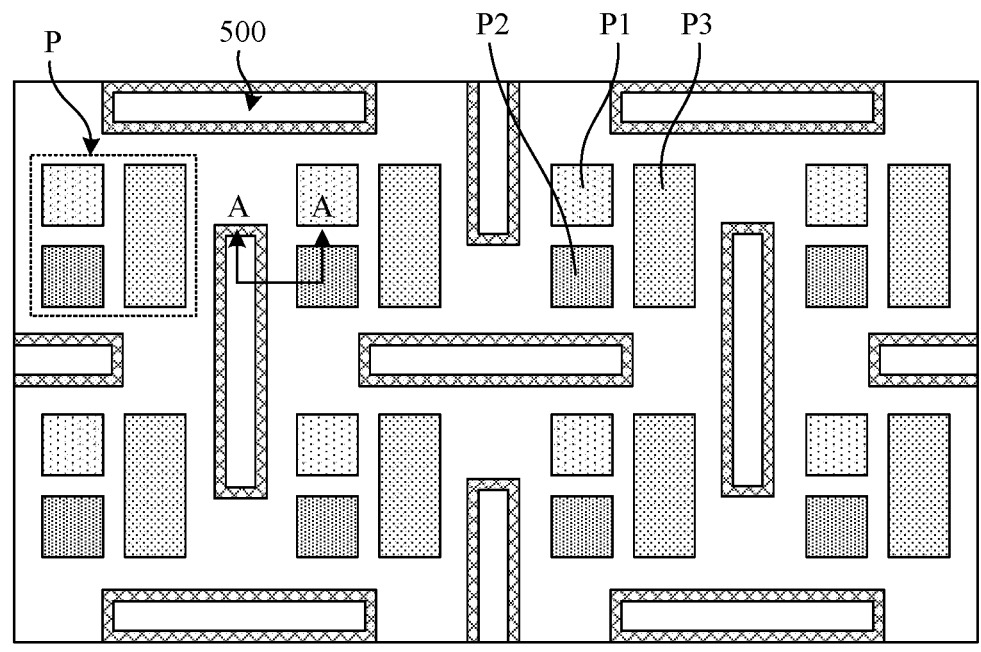
FIG. 3 is a schematic diagram of a planar structure of a display region.

FIG. 3 is a schematic diagram of a planar structure of a display region. As shown in FIG. 3, the display region of the display substrate may include a plurality of pixel islands arranged in a matrix, the pixel island may include at least one pixel unit P, the pixel unit P may include a first sub-pixel P1 emitting a first color light, a second sub-pixel P2 emitting a second color light, and a third sub-pixel P3 emitting a third color light. The sub-pixel may include a pixel drive circuit and a light emitting device. Pixel drive circuits in the first sub-pixel P1, the second sub-pixel P2, and the third sub-pixel P3 are connected with a scan signal line, a data signal line, and a light emitting signal line respectively. The pixel drive circuit is configured to receive a data voltage transmitted by a data signal line under control of a scan signal line and a light emitting signal line, and output a corresponding current to the light emitting device. Each light emitting device in the first sub-pixel P1, the second sub-pixel P2, and the third sub-pixel P3 is connected with a pixel drive circuit of a sub-pixel where the light emitting device is located, and is configured to emit light with corresponding brightness in response to a current output by the pixel drive circuit of the sub-pixel where the light emitting device is located. In an exemplary implementation mode, the first sub-pixel P1 may be a red (R) sub-pixel, the second sub-pixel P2 may be a green (G) sub-pixel, and the third sub-pixel P3 may be a blue (B) sub-pixel. In an exemplary implementation mode, a pixel unit P may include four sub-pixels, such as a red sub-pixel, a green sub-pixel, a blue sub-pixel, and a white sub-pixel. In an exemplary implementation mode, a shape of a sub-pixel in a pixel unit may be a rectangle, a rhombus, a pentagon, or a hexagon. When the pixel unit includes three sub-pixels, the three light emitting units may be arranged side by side horizontally, side by side vertically, or in a manner like a Chinese character " 品 ", and when the pixel unit includes four sub-pixels, the four light emitting units may be arranged side by side horizontally, side by side vertically, or in a manner of a square, which is not limited in the present disclosure.

In an exemplary implementation mode, the display region may include a plurality of stretch holes 500, the stretch holes 500 are disposed between pixel islands and configured to increase a deformable amount of the display substrate. On a plane perpendicular to the display substrate, a base substrate and a structural film layer in a stretch hole 500 are completely removed to form a through hole structure, or a base substrate and a structural film layer in a stretch hole 500 are partially removed to form a blind hole structure. On a plane parallel to the display substrate, a shape of a stretch hole may include any one or more of following: an "I" shape, a "T" shape, an "L" shape, and an "H" shape, and the present disclosure is not limited herein.

In an exemplary implementation mode, a plurality of stretch holes may be provided in the bezel region, and the stretch holes in the bezel region may be provided in a manner similar to that in the display region.

Figure 4:
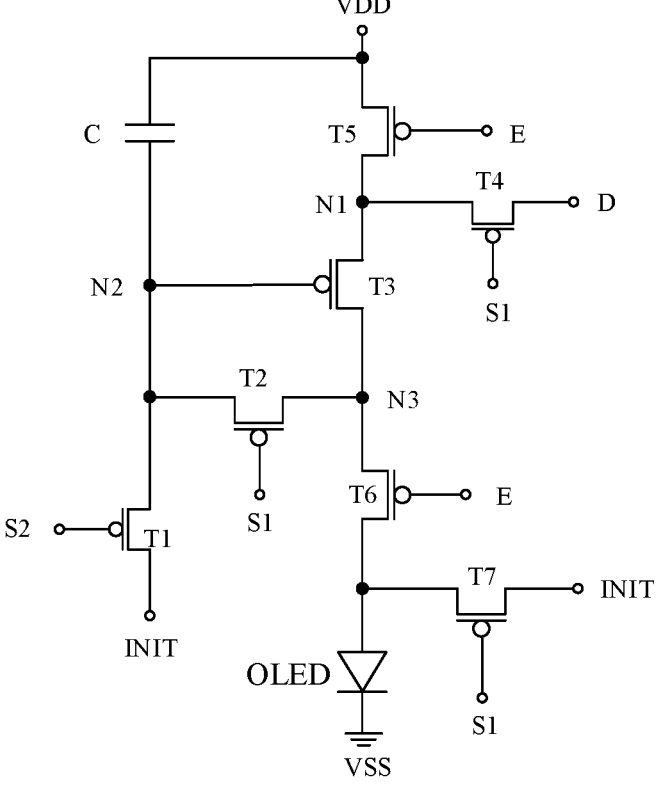
FIG. 4 is a schematic diagram of an equivalent circuit of an OLED pixel drive circuit.

In an exemplary implementation, the pixel drive circuit may have a structure of 3T1C, 4T1C, 5T1C, 5T2C, 6T1C, 7T1C or 8T2C, etc. FIG. 4 is a schematic diagram of an equivalent circuit of a pixel drive circuit. As shown in FIG. 4, the pixel drive circuit may include seven transistors (a first transistor T1 to a seventh transistor T7), a storage capacitor C, and seven signal lines (a first scan signal line S1, a second scan signal line S2, a light emitting signal line E, a data signal line D, an initial signal line INIT, a first power supply line VDD, and a second power supply line VSS).

In an exemplary implementation, a first end of the storage capacitor C is connected with the first power supply line VDD, and the second end of the storage capacitor C is connected with the second node N2, i.e., the second end of the storage capacitor C is connected with the control electrode of the third transistor T3.

A control electrode of the first transistor T1 is connected with the second scan signal line S2, a first electrode of the first transistor T1 is connected with an initial signal line INIT, and the second electrode of the first transistor is connected with the second node N2. When a scan signal with an on-level is applied to the second scan signal line S2, the first transistor T1 transmits an initialization voltage to the control electrode of the third transistor T3 so as to initialize a charge amount of the control electrode of the third transistor T3.

A control electrode of the second transistor T2 is connected with the first scan signal line S1, the first electrode of the second transistor T2 is connected with the second node N2, and the second electrode of the second transistor T2 is connected with the third node N3. When a scan signal with an on-level is applied to the first scan signal line S1, the second transistor T2 enables the control electrode of the third transistor T3 to be connected with a second electrode of the third transistor T3.

The control electrode of the third transistor T3 is connected with the second node N2, i.e., the control electrode of the third transistor T3 is connected with the second end of the storage capacitor C, a first electrode of the third transistor T3 is connected with the first node N1, and the second electrode of the third transistor T3 is connected with the third node N3. The third transistor T3 may be referred to as a drive transistor, and the third transistor T3 determines an amount of a drive current flowing between the first power supply line VDD and the second power supply line VSS according to a potential difference between the control electrode and the first electrode of the third transistor T3.

A control electrode of the fourth transistor T4 is connected with the first scan signal line S1, a first electrode of the fourth transistor T4 is connected with the data signal line D, and a second electrode of the fourth transistor T4 is connected with the first node N1. The fourth transistor T4 may be referred to as a switch transistor, a scan transistor, etc., and when a scan signal with an on-level is applied to the first scan signal line S1, the fourth transistor T4 enables a data voltage of the data signal line D to be input to the pixel drive circuit.

A control electrode of the fifth transistor T5 is connected with the light emitting signal line E, a first electrode of the fifth transistor T5 is connected with the first power supply line VDD, and a second electrode of the fifth transistor T5 is connected with the first node N1. A control electrode of the sixth transistor T6 is connected with the light emitting signal line E, a first electrode of the sixth transistor T6 is connected with the third node N3, and a second electrode of the sixth transistor T6 is connected with a first electrode of a light emitting device. The fifth transistor T5 and the sixth transistor T6 may be referred to as light emitting transistors. When a light emitting signal with an on-level is applied to the light emitting signal line E, the fifth transistor T5 and the sixth transistor T6 enable the light emitting device to emit light by forming a drive current path between the first power supply line VDD and the second power supply line VSS.

A control electrode of the seventh transistor T7 is connected with the first scan signal line S1, a first electrode of the seventh transistor T7 is connected with the initial signal line INIT, and a second electrode of the seventh transistor T7 is connected with the first electrode of the light emitting device. When a scan signal with an on-level is applied to the first scan signal line S1, the seventh transistor T7 transmits an initialization voltage to the first electrode of the light emitting device so as to initialize a charge amount accumulated in the first electrode of the light emitting device or release a charge amount accumulated in the first electrode of the light emitting device.

In an exemplary implementation, a second electrode of the light emitting device is connected with the second power supply line VSS, a signal of the second power supply line VSS is a low-level signal, and a signal of the first power supply line VDD is a high-level signal continuously provided. The first scan signal line S1 is a scan signal line in a pixel drive circuit of a current display row, and the second scan signal line S2 is a scan signal line in a pixel drive circuit of a previous display row. That is, for an n-th display row, the first scan signal line S1 is S(n), and the second scan signal line S2 is S(n−1). The second scan signal line S2 of the current display row and the first scan signal line S1 in the pixel drive circuit of the previous display row are a same signal line, thus signal lines of the display panel may be reduced, so that a narrow bezel of the display panel is achieved.

In an exemplary implementation, the first transistor T1 to the seventh transistor T7 may be P-type transistors or N-type transistors. Use of a same type of transistors in a pixel drive circuit may simplify a process flow, reduce process difficulties of a display panel, and improve a product yield. In some possible implementations, the first transistor T1 to the seventh transistor T7 may include P-type transistors and N-type transistors.

In an exemplary implementation, the first scan signal line S1, the second scan signal line S2, the light emitting signal line E, and the initial signal line INIT extend in a horizontal direction, and the second power supply line VSS, the first power supply line VDD, and the data signal line D extend in a vertical direction.

In an exemplary implementation, the light emitting device may be an organic light emitting diode (OLED), including a first electrode (anode), an organic light emitting layer, and a second electrode (cathode) that are stacked.

Figure 5:
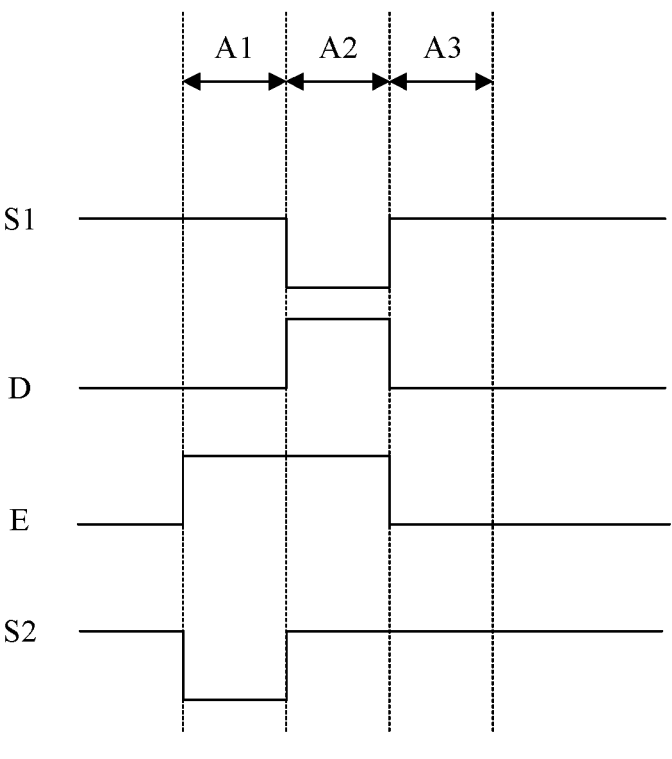
FIG. 5 is a working timing diagram of a pixel drive circuit.

FIG. 5 is a working timing diagram of a pixel drive circuit. An exemplary embodiment of the present disclosure will be described below through a working process of the pixel drive circuit shown in FIG. 4. The pixel drive circuit in FIG. 4 includes seven transistors (a first transistor T1 to a seventh transistor T7), one storage capacitor C, and seven signal lines (a data signal line D, a first scan signal line S1, a second scan signal line S2, a light emitting signal line E, an initial signal line INIT, a first power supply line VDD, and a second power supply line VSS), wherein all of the seven transistors are P-type transistors.

In an exemplary implementation, the working process of the pixel drive circuit may include following stages.

In a first stage A1, referred to as a reset stage, a signal of the second scan signal line S2 is a low-level signal, and signals of the first scan signal line S1 and the light emitting signal line E are high-level signals. The signal of the second scan signal line S2 is a low-level signal, so that the first transistor T1 is turned on, and a signal of the initial signal line INIT is provided to a second node N2 to initialize the storage capacitor C to clear an original data voltage in the storage capacitor. The signals of the first scan signal line S1 and the light emitting signal line E are high-level signals, so that the second transistor T2, the fourth transistor T4, the fifth transistor T5, the sixth transistor T6, and the seventh transistor T7 are turned off. An OLED does not emit light in this stage.

In a second stage A2, referred to as a data writing stage or a threshold compensation stage, the signal of the first scan signal line S1 is a low-level signal, signals of the second scan signal line S2 and the light emitting signal line E are high-level signals, and the data signal line D outputs a data voltage. In this stage, a second end of the storage capacitor C is at a low level, so the third transistor T3 is turned on. The signal of the first scan signal line S1 is a low-level signal, so that the second transistor T2, the fourth transistor T4, and the seventh transistor T7 are turned on. The second transistor T2 and the fourth transistor T4 are turned on, so that the data voltage output by the data signal line D is provided to the second node N2 through a first node N1, the turned-on third transistor T3, a third node N3, and the turned-on second transistor T2, and the storage capacitor C is charged with a difference between the data voltage output by the data signal line D and a threshold voltage of the third transistor T3. A voltage at the second end (the second node N2) of the storage capacitor C is Vd−|Vth|, wherein Vd is the data voltage output by the data signal line D, and Vth is the threshold voltage of the third transistor T3. The seventh transistor T7 is turned on, so that an initialization voltage of the initial signal line INIT is provided to a first electrode of the OLED to initialize (reset) the first electrode of the OLED and clear a pre-stored voltage therein, thereby completing initialization to ensure that the OLED does not emit light. The signal of the second scan signal line S2 is a high-level signal, so that the first transistor T1 is turned off. The signal of the light emitting signal line E is a high-level signal, so that the fifth transistor T5 and the sixth transistor T6 are turned off.

In a third stage A3, referred to as a light emitting stage, the signal of the light emitting signal line E is a low-level signal, and the signals of the first scan signal line S1 and the second scan signal line S2 are high-level signals. The signal of the light emitting signal line E is a low-level signal, so that the fifth transistor T5 and the sixth transistor T6 are turned on, and a power voltage output by the first power supply line VDD provides a drive voltage to the first electrode of the OLED through the turned-on fifth transistor T5, third transistor T3, and sixth transistor T6 to drive the OLED to emit light.

In a drive process of the pixel drive circuit, a drive current flowing through the third transistor T3 (drive transistor) is determined by a voltage difference between a gate electrode and a first electrode of the third transistor T3. The voltage of the second node N2 is Vdata−|Vth|, so the drive current of the third transistor T3 is as follows.

$$I = K^*(Vgs-Vth)^2 = K^*[(Vdd-Vd+|Vth|)-Vth]^2 = K^*[(Vdd-Vd)]^2$$

Herein, i is the drive current flowing through the third transistor T3, i.e., a drive current for driving the OLED, K is a constant, Vgs is the voltage difference between the gate electrode and the first electrode of the third transistor T3, Vth is the threshold voltage of the third transistor T3, Vd is the data voltage output by the data signal line D, and Vdd is the power voltage output by the first power supply line VDD.

In an exemplary implementation mode, in a plane perpendicular to a display substrate, the display substrate may include a drive structure layer disposed on a base substrate, an emitting structure layer disposed on the drive structure layer, and an encapsulation layer disposed on a light emitting element. The drive structure layer includes a pixel drive circuit, the emitting structure layer includes a light emitting device, and the light emitting device is connected with the pixel drive circuit.

Figure 6:
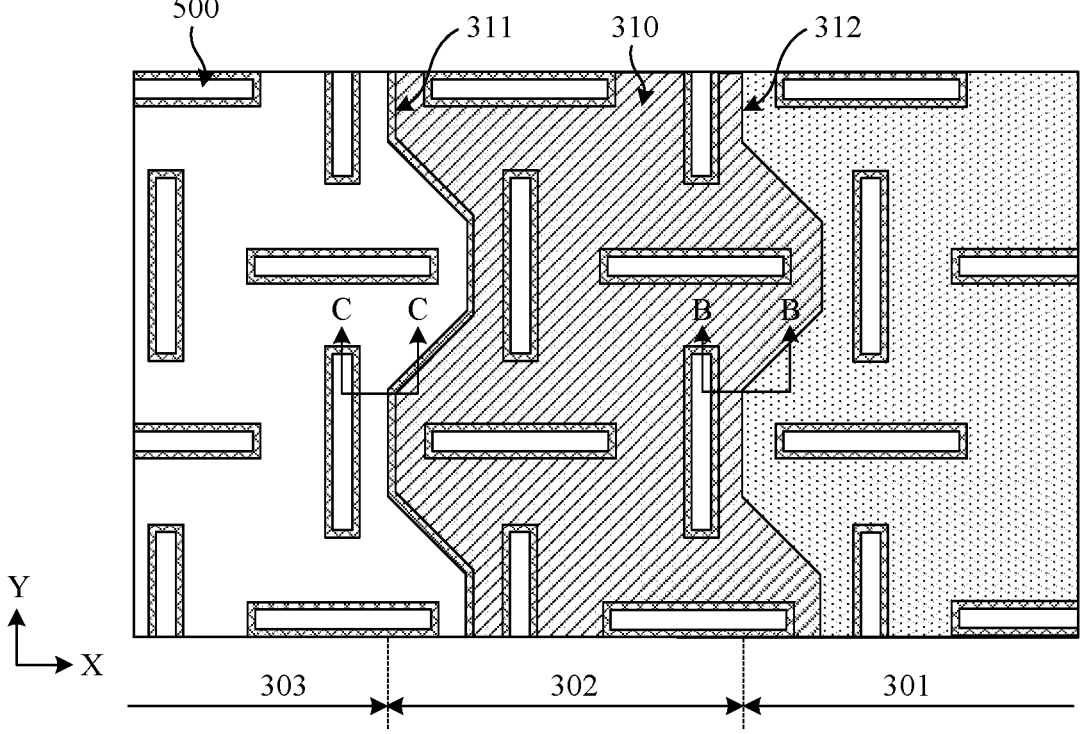
FIG. 6 is a schematic diagram of a planar structure of a bezel region in a display substrate.

FIG. 6 is a schematic diagram of a planar structure of a bezel region in a display substrate, and is an enlarged view of the E region in FIG. 2. As shown in FIG. 6, in a plane parallel to the display substrate, the bezel region 300 may include a circuit region 301, a power supply line region 302 and an edge region 303 disposed sequentially in a direction away from the display region. In an exemplary implementation mode, the circuit region 301 may include a Gate Driver on Array (GOA for short) connected to first scan lines and second scan lines of a plurality of sub-pixels in the display region. The power supply line region 302 may include a power supply line 310 connected to a second power supply line VSS of a plurality of sub-pixels in the display region. The edge region 303 may include a crack dam and a cutting groove, the crack dam includes a plurality of cracks provided on a composite insulation layer, the plurality of cracks are configured to reduce stress on the display region and the circuit region during the cutting process, avoid affecting the film layer structure of the display region and the circuit region, and cut off the propagation of the cracks in the direction of the display region and the circuit region. The cutting groove includes a groove provided on the composite insulation layer, and the cutting groove is configured such that after all film layers of the display substrate are prepared, a cutting device cuts along the cutting groove respectively. In an exemplary implementation mode, the circuit region 301 and the power supply line region 302 may not be overlapped or may be partially overlapped, which is not limited in the present disclosure.

In an exemplary implementation mode, a low voltage required by pixel drive circuits in a plurality of sub-pixels of the display region is introduced from a bonding pad of the bonding region, passes through the bonding region, enters a bezel region, and is delivered to a second power supply line VSS of each pixel drive circuit through a annular power supply line in the bezel region. Due to the existence of a certain impedance in the power supply line, there is a voltage drop in the transmission of a voltage signal, so the width of the power supply line is larger to improve the uniformity of display brightness.

In an exemplary implementation mode, a plurality of stretch holes 500 may be provided in each of the circuit region 301, the power supply line region 302 and the edge region 303. The plurality of stretch holes 500 in each region may include stretch holes in a first direction and stretch holes in a second direction. The stretch holes in the first direction are strip-shaped holes extending along the first direction X, the stretch holes in the second direction are strip-shaped holes extending along the second direction Y, and the first direction X and the second direction Y intersect. In an exemplary implementation mode, in the first direction X, the stretch holes in the first direction and the stretch holes in the second direction are alternately disposed, a stretch hole in the first direction is disposed between two stretch holes in the second direction, or a stretch hole in the second direction is disposed between two stretch holes in the first direction. In the second direction Y, the stretch holes in the first direction and the stretch holes in the second direction are alternately disposed, a stretch hole in the first direction is disposed between two stretch holes in the second direction, or a stretch hole in the second direction is disposed between two stretch holes in the first direction.

In an exemplary implementation mode, the power supply line 310 of the power supply line region 302 has a first edge 311 in a form of a bending line that is an edge on the side of the power supply line 310 away from the display region and/or a second edge 312 in a form of a bending line that is an edge on the side of the power supply line 310 close to the display region. In an exemplary implementation mode, the orthographic projection of the first edge 311 and/or the second edge 312 on the plane of the display substrate does not overlap the orthographic projection of the stretch hole 500 on the plane of the display substrate.

In an exemplary implementation mode, the first edge may include a plurality of first straight lines and a plurality of first bending lines, the first straight lines and the first bending lines are alternately disposed and connected to each other to form the first edge in a form of a bending line. The second edge may include a plurality of second straight lines and a plurality of second bending lines, the second straight lines and the second bending lines are alternately disposed and connected to each other to form the second edge in a form of a bending line.

In an exemplary implementation mode, the first straight line and the second straight line can be parallel to the second direction Y, the first bending line is a bending line projecting in a direction away from the display region or recessed in a direction close to the display region with respect to the first straight line, and the second bending line is a bending line projecting in a direction away from the display region or recessed in a direction close to the display region with respect to the second straight line.

In an exemplary implementation mode, the first bending line or the second bending line may include a first line segment, a second line segment, and a third line segment connected sequentially, the first line segment may be deflected at a first angle relative to the first straight line or the second straight line, and the third line segment may be deflected at a second angle relative to the first straight line or the second straight line.

In an exemplary implementation mode, the second line segment may be parallel to the second direction Y, and the first segment and third line segment may be disposed symmetrically with respect to a center line of the second line segment, the center line of the second line segment is a straight line extending along the first direction X and bisecting the second line segment.

In an exemplary implementation mode, the stretch holes in the first direction and the stretch holes in the second direction can be provided on two sides of the first straight line, respectively, and the stretch holes in the first direction and the stretch holes in the second direction may be provided on two sides of the second line segment, respectively. For example, taking a case where the first bending line is a bending line projecting in a direction away from the display region as an example, one stretch hole in the first direction is provided on the side of the first straight line away from the display region, and another stretch hole in the second direction is provided on the side of the first straight line close to the display region. One stretch hole in the second directional is provided on the side of the second line segment away from the display region, and another stretch hole in the first directional is provided on the side of the second line segment close to the display region.

In exemplary embodiments of the present disclosure, by setting the first edge 311 and/or the second edge 312 of the power supply line 310 in a form of a bending line, the orthographic projection of the first edge 311 and/or the second edge 312 on the plane of the display substrate does not overlap the orthographic projection of the stretch hole 500 on the plane of the display substrate, the edge of the power supply line avoids the stretch hole, which can not only make the edge of the power supply line not affect the stress distribution of the stretch hole, but also effectively avoid the peeling of the edge of the power supply line caused by the stretching deformation of the stretch hole, thereby preventing the encapsulation failure caused by the water-oxygen channel formed by the peeling of the edge of the power supply line.

Figure 7A:
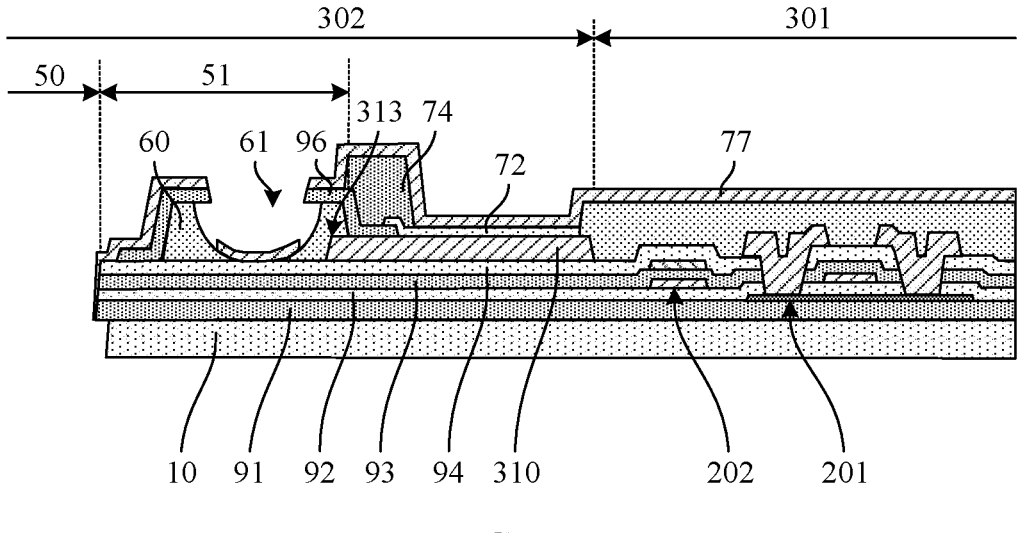
FIG. 7a and FIG. 7b are schematic diagrams of a cross-sectional structure of a display substrate according to an exemplary embodiment of the present disclosure.
Figure 7B:
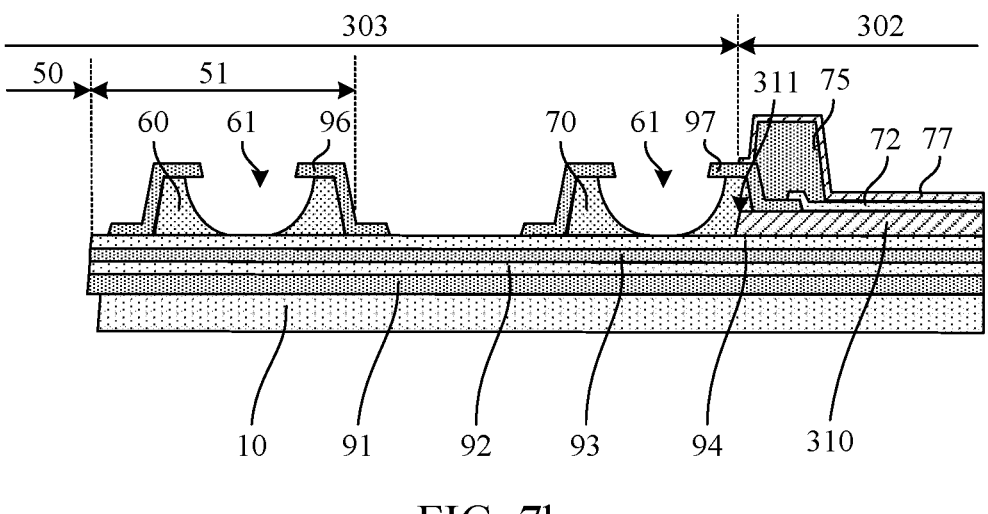

FIG. 7a and FIG. 7b are schematic diagrams of a cross-sectional structure of a display substrate according to an exemplary embodiment of the present disclosure. FIG. 7a illustrates a cross-sectional structure at the interface between the circuit region 301 and the power supply line region 302 and is a cross-sectional view taken along a B-B direction in FIG. 6. FIG. 7b illustrates a cross-sectional structure at the interface between the power supply line region 302 and the edge region 303 and is a cross-sectional view taken along a C-C direction in FIG. 6. In an exemplary implementation mode, the stretch hole may include a hole region 50 and a partition region 51 surrounding the hole region 50, the partition region 51 is provided with a first partition structure surrounding the hole region 50. In a plane perpendicular to the display substrate, the first partition structure includes a first partition layer 60 surrounding the hole region 50 and a first inorganic layer 96 disposed on the first partition layer 60, a partition groove 61 surrounding the hole region 50 is provided on the first partition layer 60, a partition hole surrounding the hole region 50 is provided on the first inorganic layer 96, and the partition hole is communicated with the partition groove. The first inorganic layer 96 located at the periphery of the partition hole has a protrusion with respect to the side wall of the partition groove 61, and the protrusion and the side wall of the partition groove form a recessed structure.

In an exemplary implementation mode, the first inorganic layer serves as the first cover layer of the present disclosure. In some possible implementation modes, the first cover layer may be made of a metallic material or other material with a different etching rate from the etching rate of the first partition layer (which is made of an organic material), which is not limited in the present disclosure.

In a plane perpendicular to the base substrate, the power supply line region 302 may include a composite insulation layer disposed on the base substrate 10 and a power supply line 310 disposed on the composite insulation layer. In an exemplary implementation mode, the composite insulation layer may include a first insulation layer 91, a second insulation layer 92, a third insulation layer 93, and a fourth insulation layer 94 which are stacked.

In an exemplary implementation mode, the first partition layer 60 in the first partition structure covers the edge 313 of the hole region on the side of the power supply line 310 close to the hole region 50, and the first inorganic layer 96 on the side of the first partition structure away from the hole region 50 is lapped on the power supply line 310.

In an exemplary implementation mode, the power supply line region 302 may include a connection electrode 72 disposed on the side of the power supply line 310 away from the base substrate and connected to the power supply line 310 in a lap manner. The side of the connection electrode 72 close to the hole region 50 covers the edge of the first inorganic layer 96 on a side away from the hole region 50, and the first inorganic layer 96 is a first inorganic layer 96 in the first partition structure lapped on the power supply line 310.

In an exemplary implementation mode, the power supply line region 302 may include a first partition dam 74 that is an annular body surrounding the hole region 50 and disposed on the side of the first partition structure away from the hole region 50.

A side of the first partition dam 74 close to the hole region 50 is disposed on the first inorganic layer 96 which is a first inorganic layer 96 lapped on the power supply line 310 in the first partition structure, and a side of the first partition dam 74 away from the hole region 50 covers the edge of the connection electrode 72 on a side close to the hole region 50.

In an exemplary implementation mode, the power supply line region 302 may include a cathode 77 disposed on the side of the connection electrode 72 away from the base substrate, connected to the connection electrode 72 in a lap manner, and the cathode wraps the first partition dam 74, i.e., the cathode 77 covers the entire exposed surface of the first partition dam 74.

In an exemplary implementation mode, a side of the first edge 311 of the power supply line 310 away from the display region may be provided with a second partition structure, the second partition structure includes a second partition layer 70 extending along the first edge 311 and a second inorganic layer 97 disposed on the second partition layer 70, a partition groove 61 extending along the first edge 311 is provided on the second partition layer 70, and a partition hole extending along the first edge 311 is provided on the second inorganic layer 97, and the partition hole is communicated with the partition groove. The second inorganic layer 97 located at the periphery of the partition hole has a protrusion with respect to the side wall of the partition groove 61, and the protrusion and the side wall of the partition groove form a recessed structure.

In an exemplary implementation mode, the second inorganic layer 97 serves as the second cover layer of the present disclosure. In some possible implementation modes, the second cover layer may be made of a metallic material or other material having a different etching rate from the etching rate of the second partition layer (which is made of an organic material), which is not limited in the present disclosure.

In an exemplary implementation mode, the second partition layer 70 in the second partition structure covers the first edge 311 of the power supply line 310, and the second inorganic layer 97 on the side of the second partition structure close to the display region is lapped on the power supply line 310.

In an exemplary implementation mode, a side of the connection electrode 72 close to the first edge 311 covers an edge on the side of the second inorganic layer 97 close to the display region, and the second inorganic layer 97 is a second inorganic layer 97 in the second partition structure lapped on the power supply line 310.

In an exemplary implementation mode, the power supply line region 302 may include a second partition dam 75, the second partition dam 75 is a linear body extending along the first edge 311, and is disposed on the side of the second partition structure close to the display region, a side of the second partition dam 75 away from the display region is disposed on the second inorganic layer 97 which is a second inorganic layer 97 in the second partition structure lapped on the power supply line 310, and a side of the second partition dam 75 close to the display region covers the edge of the connection electrode 72 on a side close to the first edge 311.

In an exemplary implementation mode, the cathode 77 wraps the second partition dam 75 i.e., the cathode 77 covers the entire exposed surface of the second partition dam 75.

In an exemplary implementation mode, in a plane perpendicular to the display substrate, the inner wall of the hole region 50 includes a base substrate segment, an organic material segment and an inorganic material segment.

In an exemplary implementation mode, the display region may include a drive circuit layer disposed on the base substrate and a light emitting structure layer disposed on the drive circuit layer. The first partition layer 60 and the second partition layer 70 may be disposed on the same layer as the planarization layer in the drive circuit layer, and the first partition dam 74 and the second partition dam 75 may be disposed on the same layer as the pixel definition layer in the light emitting structure layer.

In an exemplary implementation mode, the first inorganic layer and the second inorganic layer are disposed on a same layer and are disposed on the same layer as one of the insulation layers in the display region.

In an exemplary implementation mode, a third inorganic layer is further provided over the first inorganic layer and/or the second inorganic layer, the third inorganic layer covers the first partition structure and/or the second partition structure.

Exemplary description is made below through a preparation process of a display substrate. A "patterning process" mentioned in the present disclosure includes coating with a photoresist, mask exposure, development, etching, photoresist stripping, and other treatments for a metal material, an inorganic material, or a transparent conductive material, and includes coating with an organic material, mask exposure, development, and other treatments for an organic material. Deposition may be any one or more of sputtering, evaporation, and chemical vapor deposition. Coating may be any one or more of spray coating, spin coating, and ink-jet printing. Etching may be any one or more of dry etching and wet etching, which is not limited in present disclosure. A "thin film" refers to a layer of thin film made of a material on a base substrate through a process such as deposition, coating, etc. If the "thin film" does not need a patterning process in an entire preparation process, the "thin film" may also be called a "layer". If the "thin film" needs a patterning process in an entire preparation process, it is called a "thin film" before the patterning process, and called a "layer" after the patterning process. The "layer" after the patterning process includes at least one "pattern". "A and B being disposed on a same layer" mentioned in the present disclosure means that A and B are formed simultaneously through a same patterning process, and a "thickness" of a film layer is a dimension of the film layer in a direction perpendicular to a display substrate. In an exemplary implementation mode, of the present disclosure, "the orthographic projection of B is within a range of the orthographic projection of A" refers to a boundary of the orthographic projection of B falling within a range of a boundary of the orthographic projection of A, or a boundary of the orthographic projection of A is overlapped with a boundary of the orthographic projection of B.

In an exemplary implementation mode, a preparation process of the display substrate according to the exemplary embodiment of the present disclosure include following operations.

(11) Preparing a base substrate on a glass carrier plate. In an exemplary implementation mode, the base substrate may include a first flexible material layer, a first inorganic material layer, a second flexible material layer, and a second inorganic material layer stacked on the glass carrier plate. A material of the first flexible material layer and the second flexible material layer may be Polyimide (PI), Polyethylene Terephthalate (PET), or a polymer soft film subjected to a surface treatment, etc. A material of the first inorganic material layer and the second inorganic material layer may be Silicon Nitride (SiNx) or Silicon Oxide (SiOx), etc., which are used for improving water and oxygen resistance of the base substrate. The first inorganic material layer and the second inorganic material layer may be referred to as barrier layers or buffer layers. In an exemplary implementation mode, taking a laminated structure PI 1/Barrier 1/PI 2/Barrier 2 as an example, a preparation process may include: coating a layer of polyimide on a glass carrier plate 1 first, and forming a first flexible (PI 1) layer after the layer of polyimide is cured to form a film; subsequently, depositing a layer of barrier thin film on the first flexible layer to form a first barrier (Barrier 1) layer covering the first flexible layer; then coating a layer of polyimide again on the first barrier layer, and forming a second flexible (PI 2) layer after the layer of polyimide is cured to form a film; then depositing a layer of barrier thin film on the second flexible layer to form a second barrier (Barrier 2) layer covering the second flexible layer, so as to complete preparation of the base substrate. In an exemplary implementation mode, an amorphous Silicon (a-Si) layer may be provided between the first barrier layer and the second inorganic material layer, the base substrate may include a first flexible material layer, a first inorganic material layer, a semiconductor layer, a second flexible material layer, and a second inorganic material layer that are stacked on the glass carrier plate. In an exemplary implementation mode, in a process of forming the first barrier layer, an inorganic hole may be formed on the first barrier layer through a patterning process, and a position of the inorganic hole may correspond to a position of a through hole to be formed subsequently. The display region, the circuit region 301, the power supply line region 302 and the edge region 303 each include a base substrate after this process.

(12) Preparing patterns of a drive structure layer of the display region, a circuit structure layer of the circuit region, a power supply structure layer of the power supply line region, and an edge structure layer of the edge region on the base substrate 10.

In an exemplary implementation mode, the drive structure layer of the display region may include a first transistor 101 and a first storage capacitor 102 constituting a pixel drive circuit, a circuit structure layer of the circuit region 301 may include a second transistor 201 and a second storage capacitor 202 forming a gate drive circuit, the power supply structure layer of the power supply line region 302 may include a composite insulation layer disposed on the base substrate and a power supply line 310 disposed on the composite insulation layer, and the edge structure layer of the edge region 303 may include a composite insulation layer. In an exemplary implementation mode, the composite insulation layer may include a plurality of stacked inorganic insulation layers.

In an exemplary implementation mode, the process of preparing patterns of a drive structure layer of the display region, a circuit structure layer of the circuit region, a power supply structure layer of the power supply line region, and an edge structure layer of the edge region may include the following operations.

A first insulation film and a semiconductor film are sequentially deposited on the base substrate 10, the semiconductor film is patterned by a patterning process to form a first insulation layer 91 on the base substrate 10, and a pattern of a semiconductor layer disposed on the first insulation layer 91, the pattern of the semiconductor layer includes at least a first active layer 11 located in the display region and a second active layer 21 located in the circuit region 301. After this process, the semiconductor films of the power supply line region 302 and the edge region 303 are etched away, the power supply line region 302 and the edge region 303 includes the base substrate 10 provided on the glass carrier plate 1 and the first insulation layer 91 provided on the base substrate 10.

Subsequently, a second insulation thin film and a first metal thin film are sequentially deposited, and the first metal thin film is patterned through a patterning process to form a second insulation layer 92 covering the pattern of the semiconductor layer and a pattern of a first metal layer disposed on the second insulation layer 92, wherein the pattern of the first metal layer at least includes a first gate electrode 12 and a first capacitor electrode 31 which are located in the display region, and a second gate electrode 22 and a second capacitor electrode 41 which are located in the circuit region 301. After this process, the first metal films of the power supply line region 302 and the edge region 303 are etched away, the power supply line region 302 and the edge region 303 includes the base substrate 10 and the first insulation layer 91 and the second insulation layer 92 stacked on the base substrate 10.

Subsequently, a third insulation film and a second metal film are sequentially deposited, the second metal film is patterned by a patterning process, to form a third insulation layer 93 covering the pattern of the first metal layer and a pattern of a second metal layer disposed on the third insulation layer 93, the pattern of the second metal layer includes at least a third capacitor electrode 32 located in the display region and a fourth capacitor electrode 42 located in the circuit region 301, the position of the third capacitor electrode 32 corresponds to the position of the first capacitor electrode 31, and the position of the fourth capacitor electrode 42 corresponds to the position of the second capacitor electrode 41. After this process, the second metal films of the power supply line region 302 and the edge region 303 are etched away, the power supply line region 302 and the edge region 303 includes the base substrate 10, and the first insulation layer 91, the second insulation layer 92, and the third insulation layer 93 stacked on the base substrate 10.

Subsequently, a fourth insulation thin film is deposited, and the fourth insulation thin film is patterned through a patterning process to form a fourth insulation layer 94 covering the pattern of the second metal layer. The fourth insulation layer 94 is opened with a plurality of vias and a plurality of through holes. The plurality of vias may include a first active via located in the display region and a second active via located in the circuit region 301, the fourth insulation layer 94, the third insulation layer 93, and the second insulation layer 92 in the first active via and the second active via are etched off, the first active via exposes a source region and a drain region at two ends of the first active layer 11, and the second active via exposes a source region and a drain region at two ends of the second active layer 21. The plurality of through holes are respectively located in the display region, the circuit region 301, the power supply line region 302 and the edge region 303, and the fourth insulation layer 94, the third insulation layer 93, the second insulation layer 92, the first insulation layer 91 and the base substrate 10 within the plurality of through holes (the hole region 50) are removed to expose the surface of the glass substrate 1. After this process, the power supply line region 302 and the edge region 303 include the base substrate 10 and a composite insulation layer disposed on the base substrate 10. The through holes penetrate through the base substrate 10 and the composite insulation layer, and the composite insulation layer includes a first insulation layer 91, a second insulation layer 92, a third insulation layer 93 and a fourth insulation layer 94 which are stacked.

Figure 8A:
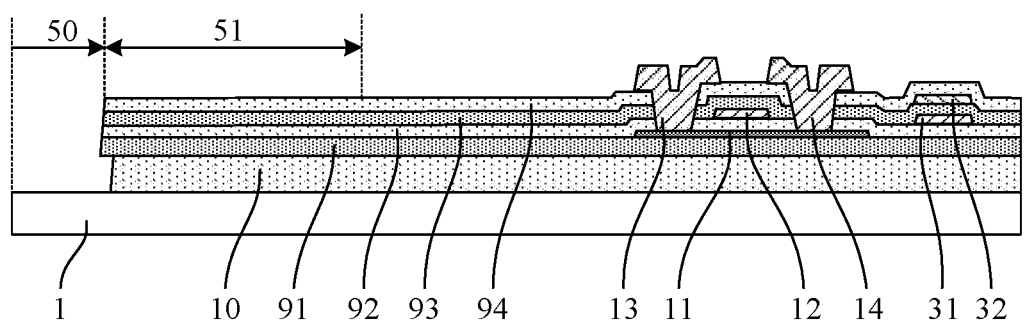
FIGS. 8a to 8c are schematic diagrams after a pattern of a drive structure layer and the like are formed according to an embodiment of the present disclosure.
Figure 8B:
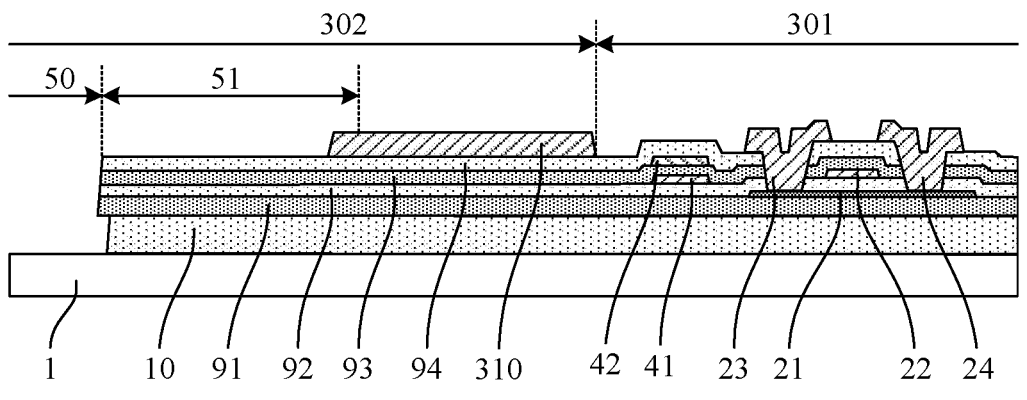
Figure 8C:
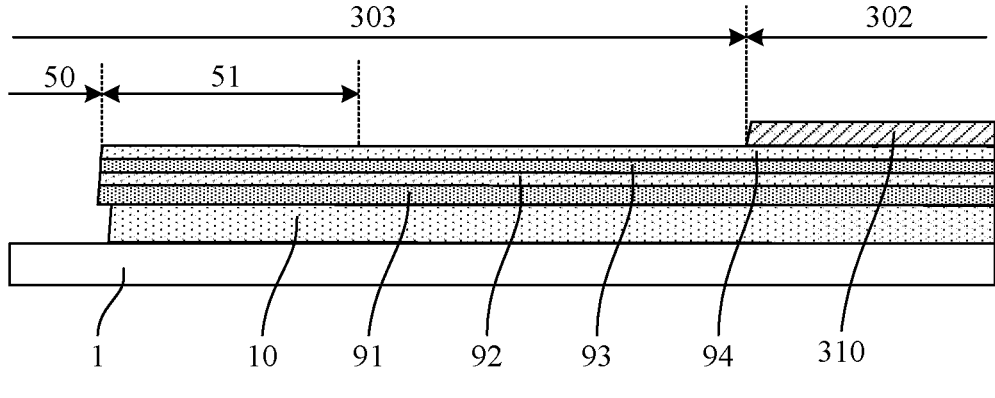

Subsequently, a third metal film is deposited, the third metal film is patterned by a patterning process, to form a pattern of a third metal layer on the fourth insulation layer 94, the pattern of the third metal layer includes at least a first source electrode 13 and a first drain electrode 14 located in the display region, the second source electrode 23 and the second drain electrode 24 located in the circuit region 301, and the power supply line 310 located in the power supply line region 302, as shown in FIGS. 8a, 8b, and 8c, FIG. 8a illustrates a cross-sectional structure of the pixel island and the stretch hole in the display region and is a cross-sectional view taken along a A-A direction in FIG. 3, FIG. 8b is a cross-sectional view taken along a B-B direction in FIG. 6, and FIG. 8c is a cross-sectional view taken along a C-C direction in FIG. 6.

So far, preparation of the patterns of the drive structure layer, the circuit structure layer, the power supply structure layer and the edge structure layer are completed. In an exemplary implementation mode, the first active layer 11, the first gate electrode 12, the first source electrode 13 and the first drain electrode 14 form a first transistor 101 of the pixel drive circuit, the second active layer 21, the second gate electrode 22, the second source electrode 23, and the second drain electrode 24 form a second transistor 201 of a gate drive circuit, the first capacitor electrode 31 and the third capacitor electrode 32 form a first storage capacitor 102 of the pixel drive circuit, and the second capacitor electrode 41 and the fourth capacitor electrode 42 form a second storage capacitor 202 of the gate drive circuit. In an exemplary implementation mode, the first transistor 101 may be a driving transistor in the pixel drive circuit, and the second transistor 201 may be a switch transistor in the gate drive circuit.

In an exemplary implementation mode, the first insulation layer, the second insulation layer, the third insulation layer, and the fourth insulation layer may be made of any one or more of Silicon Oxide (SiOx), Silicon Nitride (SiNx), and Silicon Oxynitride (SiON), and may be a single layer, a multi-layer, or a composite layer. The first insulation layer may be referred to as a buffer layer, the second insulation layer and the third insulation layer may be referred to as Gate Insulator (GI) layers, and the fourth insulation layer may be referred to as an Interlayer Dielectric (ILD) layer. The first metal thin film, the second metal thin film, and the third metal thin film may be made of a metal material, such as any one or more of silver (Ag), copper (Cu), aluminum (Al), titanium (Ti), and molybdenum (Mo), or an alloy material of the above metals, such as an Aluminum-Neodymium alloy (AlNd) or a Molybdenum-Niobium alloy (MoNb), and may be of a single-layer structure or a multi-layer composite structure, such as Ti/Al/Ti. An active layer thin film may be made of an amorphous Indium Gallium Zinc Oxide (a-IGZO), Zinc OxyNitride (ZnON), indium Zinc Tin Oxide (IZTO), amorphous Silicon (a-Si), polycrystalline Silicon (p-Si), hexathiophene, polythiophene, and other materials, that is, the present disclosure is applicable to transistors manufactured based on an oxide technology, a silicon technology, and an organic matter technology.

In an exemplary implementation mode, the stretch hole may include a hole region (i.e., a through hole) 50 and a partition region 51 surrounding the hole region 50. In the display region, the circuit region 301 and the edge region 303, the hole region 50 exposes the surface of the glass substrate 1 and the partition region 51 exposes the surface of the fourth insulation layer 94. In the power supply line region 302, the hole region 50 exposes the surface of the glass substrate 1, a region of the partition region 51 close to the hole region 50 exposes the surface of the fourth insulation layer 94, and a region of the partition region 51 away from the hole region 50 exposes the surface of the power supply line 310.

In an exemplary implementation mode, because the etching of the through hole includes etching an inorganic material layer and etching an organic material layer, and the etching rate for the organic material is higher than that for the inorganic material, so that the sidewall of the through hole forms a step, and the aperture of a base substrate through hole on the base substrate expands by a certain distance relative to an insulation through hole on the composite insulation layer. The composite insulation layer close to the periphery of the insulation through hole on a side of the base substrate through hole has a protrusion relative to the side wall of the base substrate through hole close to a side of the insulation through hole, and the protrusion and the side wall of the base through hole form a recessed structure, that is, the composite insulation layer in the inner wall of the hole region has a "eave" structure protruding from the base substrate.

In an exemplary implementation mode, the aperture of the base through hole is larger than the aperture of the insulation through hole, and the orthographic projection of the profile of the insulation through hole (close to a side of the base through hole) on the glass substrate is within the range of the orthographic projection of the profile of the base through hole (close to a side of the insulation through hole) on the glass substrate.

Figure 9A:
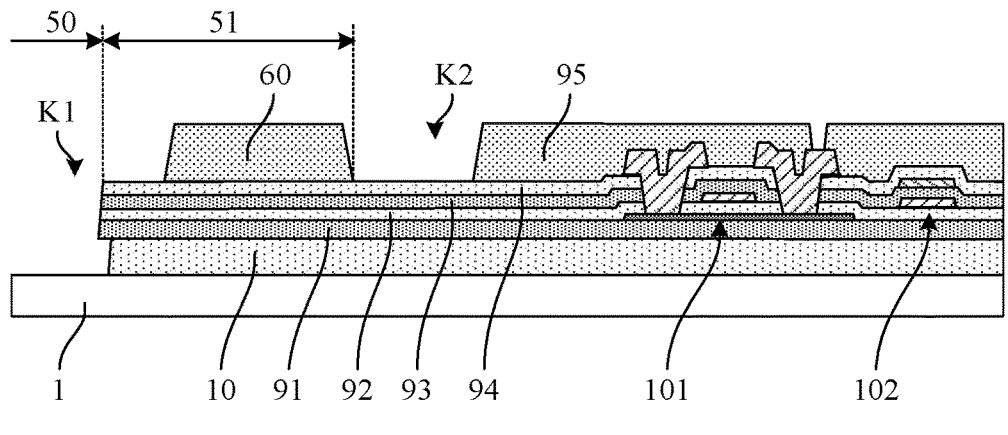
FIGS. 9a to 9c are schematic views after a pattern of a partition layer is formed according to an embodiment of the present disclosure.
Figure 9B:
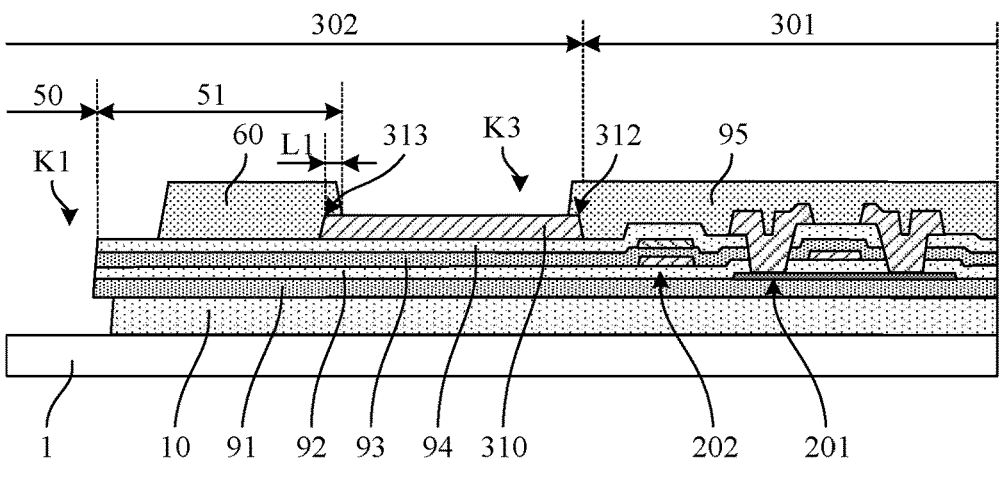
Figure 9C:
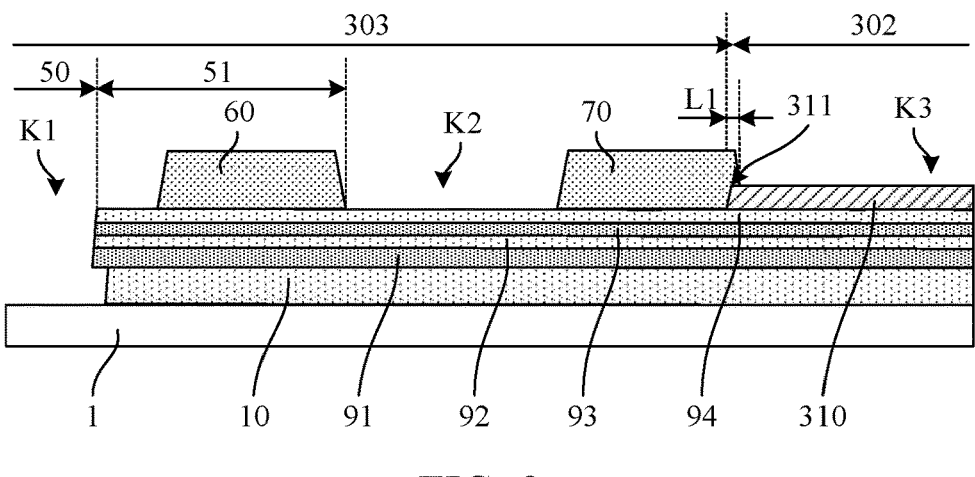

(13) Forming patterns of a planarization layer and a partition layer. In an exemplary implementation mode, forming the patterns of the planarization layer and the partition layer may include: coating a planarization film on the base substrate on which the aforementioned patterns are formed, and patterning the planarization film by a patterning process to form a planarization layer 95, patterns of a first partition layer 60 and a second partition layer 70, as shown in FIGS. 9*a*, 9*b*, and 9*c*, wherein FIG. 9*a* is a cross-sectional view taken along a A-A direction in FIG. 3, FIG. 9*b* is a cross-sectional view taken along a B-B direction in FIG. 6, and FIG. 9*c* is a cross-sectional view taken along a C-C direction in FIG. 6. In an exemplary implementation mode, the planarization film may be made of an organic material such as a resin or the like.

In an exemplary implementation mode, a planarization layer 95 is formed in the display region and the circuit region 301. The planarization layer 95 of the display region is opened with an anode via, and planarization film in the anode via is removed to expose the surface of the first drain electrode of the first transistor 101. The anode via is configured to connect an anode formed subsequently to the first transistor 101 through the via. In an exemplary implementation mode, the drive structure layer in the display region includes a planarization layer 95. The planarization layer 95 of the circuit region 301 extends to the power supply line region 302 towards a direction away from the display region and covers the second edge 312 on the side of the power supply line 310 close to the display region.

In an exemplary implementation mode, the first partition layer 60 is formed around each of the hole regions 50 in the display region, the circuit region 301, the power supply line region 302 and the edge region 303, and has a ring shape surrounding the hole region 50. The second partition layer 70 is formed on the side of the first edge 311 of the power supply line 310 away from the display region and is in the form of a bending line extending along the first edge 311.

In an exemplary implementation mode, in the display region and the circuit region 301, the planarization film on the side of the ring-shaped first partition layer 60 close to the hole region 50 is removed to form a first opening K1, which exposes the surface of the hole region and the surface of the fourth insulation layer 94 in the vicinity of the hole region 50, the planarization film on the side of the first partition layer 60 away from the hole region 50 is removed to form a second opening K2 in a ring shape between the first partition layer 60 and the planarization layer 95, and the second opening K2 exposes the surface of the fourth insulation layer 94.

In an exemplary implementation mode, in the power supply line region 302, the planarization film on the side of the ring-shaped first partition layer 60 close to the hole region 50 is removed to form a first opening K1, and the planarization film on the side of the first partition layer 60 away from the hole region 50 is removed to form a third opening K3, which exposes the surface of the power supply line 310, and the third opening K3 is configured such that a connection electrode formed subsequently is connected to the power supply line 310 through the opening. A side of the first partition layer 60 away from the hole region 50 covers the edge 313 of the hole region of the power supply line 310, which is an edge on the side of the power supply line 310 in the power supply line region 302 close to the hole region 50.

In an exemplary implementation mode, the first width L1 of a part of the first partition layer 60 covering the power supply line 310 may be greater than or equal to 2 μm, that is, the distance between the edge of the first partition layer 60 on a side away from the hole region 50 and the edge 313 of the hole region of the power supply line 310 may be greater than or equal to 2 μm, so that the edge of the hole region of the power supply line is completely covered by the first partition layer 60, which prevents peeling failure of the edge of the hole region of the power supply line.

In an exemplary implementation mode, at the first edge 311 of the power supply line region 302, the planarization film on the side of the second partition layer 70 in a form of a bending line close to the display region is removed to form a third opening K3, the third opening K3 exposes the surface of the power supply line 310, and a side of the second partition layer 70 close to the display region covers the first edge 311 of the power supply line 310, and the planarization film on the side of the second partition layer 70 away from the display region is removed.

In an exemplary implementation mode, the first width L1 of a part of the second partition layer 70 covering the power supply line 310 may be greater than or equal to 2 μm, that is, the distance between the edge on a side of the second partition layer 70 close to the display region and the first edge 311 of the power supply line 310 may be greater than or equal to 2 μm, so that the first edge of the power supply line is completely covered by the second partition layer which prevents peeling failure of the first edge of the power supply line.

In an exemplary implementation mode, in the edge region 303, the planarization film on the side of the ring-shaped first partition layer 60 close to the hole region 50 is removed to form a first opening K1, and the planarization film on a side away from the hole region 50 is removed to form a second opening K2 between the first partition layer 60 and the second partition layer 70 and between adjacent first partition layers 60.

In an exemplary implementation mode, in a plane perpendicular to the base substrate, the cross-sectional shape of the first partition layer 60 and the second partition layer 70 may be in a shape of a trapezoid, and the width of the partition layer at the side away from the base substrate is smaller than the width of the partition layer at the side close to the base substrate.

After this process, the edges of the power supply line 310 in the power supply line region 302 are all covered, the first edge 311 on the side of the power supply line 310 away from the display region is covered by the second partition layer 70, the second edge 312 on the side of the power supply line 310 close to the display region is covered by the planarization layer 95, and the edge 313 of the hole region of the stretch hole on the power supply line 310 is covered by the first partition layer 60. The edge region 303 includes a base substrate 10, a composite insulation layer disposed on the base substrate 10, and a first partition layer 60 disposed on the composite insulation layer. The edge region 303 is provided with a plurality of hole regions 50 penetrating through the base substrate 10 and the composite insulation layer, and the first partition layer 60 has a ring shape surrounding the hole regions 50.

Figure 10A:
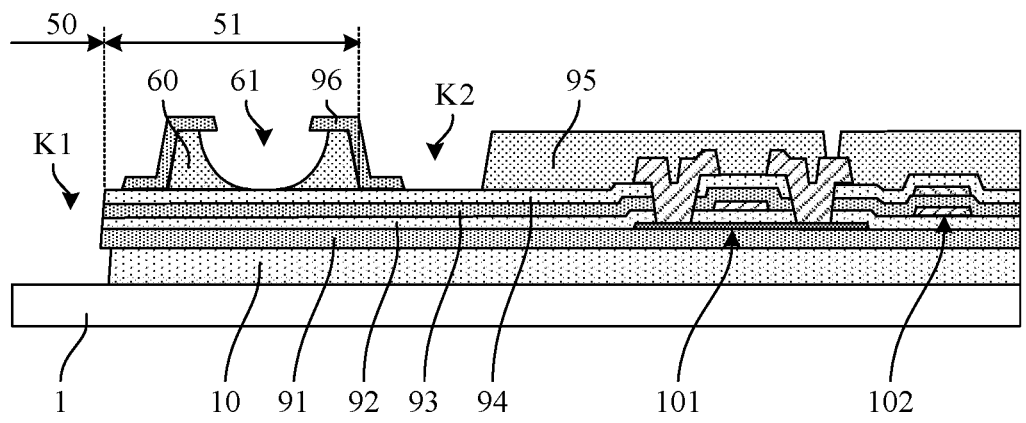
FIGS. 10a to 10f are schematic diagrams after a pattern of a partition groove is formed according to an embodiment of the present disclosure.
Figure 10B:
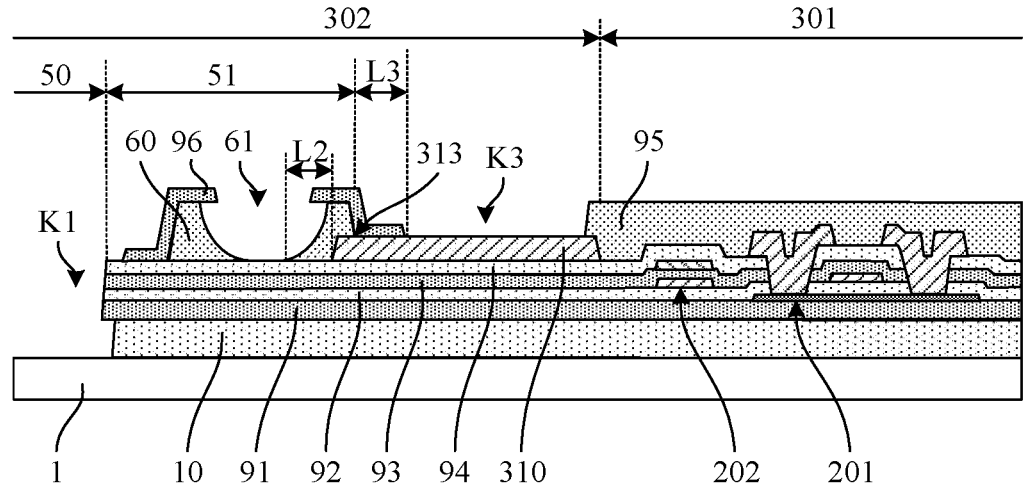
Figure 10C:
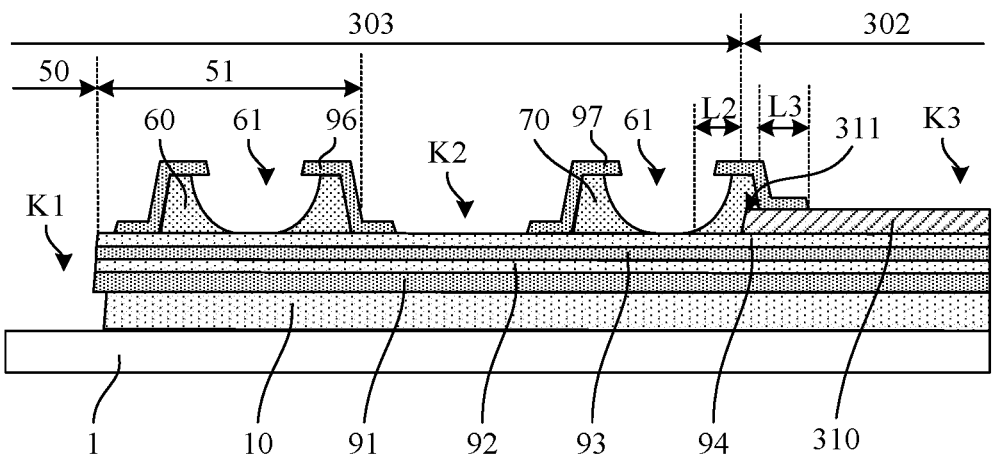

(14) Forming a pattern of a partition groove. In an exemplary implementation mode, forming the pattern of the partition groove may include: depositing an inorganic material film on the base substrate on which the aforementioned patterns are formed, patterning the inorganic material film by a patterning process, to form a first inorganic layer 96 covering the surface of the first partition layer 60, a second inorganic layer 97 covering the surface of the second partition layer 70, and a partition groove 61 provided on the first partition layer 60 and the second partition layer 70, as shown in FIGS. 10*a*, 10*b* and 10*c*, FIG. 10*a* is a cross-sectional view taken along a A-A direction in FIG. 3, FIG. 10*b* is a cross-sectional view taken along a B-B direction in FIG. 6, and FIG. 10*c* is a cross-sectional view taken along a C-C direction in FIG. 6. In an exemplary implementation mode, the inorganic material film may be made of any one or more of Silicon Oxide (SiOx), Silicon Nitride (SiNx), and Silicon Oxynitride (SiON), and may be a single-layer, a multi-layer, or a composite layer.

In an exemplary implementation mode, the process of forming the first inorganic layer, the second inorganic layer and the partition groove may include: depositing an inorganic material film on the base substrate on which the aforementioned patterns are formed, and the inorganic material film completely covers the upper surfaces and the side surfaces of the first partition layer 60 and the second partition layer 70, the upper surface is a surface on the side of the partition layer in a shape of a trapezoid away from the base substrate, and the side surface is a surface of the hypotenuse of the partition layer in a shape of a trapezoid. Subsequently, a layer of photoresist is coated on the inorganic material film, and the photoresist is exposed by using a mask. After development, a fully exposed region and an unexposed region are formed, and the photoresist in the fully exposed region is removed and the photoresist in the unexposed region is retained. Then, the inorganic material film in the fully exposed region is etched by an etching process, to form a first inorganic layer 96 completely covering the outer surface of the first partition layer 60, a second inorganic layer 97 completely covering the outer surface of the second partition layer 70, and partition holes provided on the first inorganic layer 96 and the second inorganic layer 97, respectively, the partition holes are respectively located at the positions where the upper surfaces of the first partition layer 60 and the second partition layer are located, and the partition holes expose portions of the upper surfaces of the first partition layer 60 and the second partition layer 70, respectively. Subsequently, the first partition layer and the second partition layer 70 exposed in the partition holes are continued to be etched, to form partition grooves on the first partition layer 60 and second partition layer 70, respectively, and the partition holes and the partition grooves are communicated with each other.

In an exemplary implementation mode, etching may be performed using a dry etching process and using a gas with a relatively large organic/inorganic etching ratio, such as O2, CF4, and CHF3. Due to the relatively large organic/inorganic etching ratio, that is, an etching rate for etching an organic material is greater than an etching rate for etching an inorganic material. Therefore, when the first partition layer 60 and the second partition layer 70 of the organic material are etched, there is lateral etching on the partition layer, and the partition groove on the partition layer expands a certain distance relative to the partition hole to form the partition groove 61 with a side erosion structure.

In an exemplary implementation mode, the first inorganic layer and the second inorganic layer located at the periphery of the partition hole have protrusion relative to the sidewall of the partition groove, and the protrusion and the sidewall of the partition groove (on a side close to the partition hole) form a recessed structure.

In an exemplary implementation mode, in a plane perpendicular to the base substrate, a cross-sectional shape of the partition groove is an inverted trapezoid, and a width of an upper opening of a side of the partition groove away from the base substrate is greater than a width of a lower opening of a side of the partition groove close to the base substrate. In an exemplary implementation mode, sides of the inverted trapezoid-shaped partition groove may be arc-shaped.

In an exemplary implementation mode, a side of the lower opening of the partition groove away from the hole region should be implemented so as to ensure that the edge 313 of the hole region of the power supply line 310 is not exposed, and the second width L2 between the side of the lower opening away from the hole region and the edge of the hole region of the power supply line can be greater than or equal to 1 μm, so that the edge of the hole region of the power supply line is completely covered by the first partition layer, which prevents peeling failure of the edge of the hole region of the power supply line.

In an exemplary implementation mode, a side of the lower opening of the partition groove close to the display region should be implemented so as to ensure that the first edge 311 of the power supply line 310 is not exposed, and the second width L2 between the side of the lower opening close to the display region and the first edge can be greater than or equal to 1 μm, so that the first edge of the power supply line is completely covered by the second partition layer, which prevents peeling failure of the first edge of the power supply line.

In an exemplary implementation mode, the aperture of the partition hole is smaller than the aperture of the upper opening of the partition groove, and the orthographic projection of the partition hole on the base substrate is within a range of the orthographic projection of the upper opening of the partition groove on the base substrate. The first inorganic layer 96 covering the outer surface of the first partition layer 60 and the second inorganic layer 97 covering the outer surface of the second partition layer 70 have edges protruding from the upper opening of the partition groove 61 to form a "eave" structure, and the orthographic projection of the contour of the upper opening of the partition groove 61 on the base substrate is within the range of the orthographic projection of the first inorganic layer 96 and the second inorganic layer 97 on the base substrate. In the present disclosure, by arranging the partition groove 61 with the "eave" structure, an organic emitting layer, a cathode, and an optical coupling layer which are subsequently evaporated may be effectively partitioned, and invasion of water and oxygen from the hole region may be effectively blocked.

In an exemplary implementation mode, the width of the edges of the first inorganic layer 96 and the second inorganic layer 97 protruding from of the upper opening of the partition groove may be about 1 to 3 μm, i.e., the partition groove expands 1 to 3 μm relative to the partition hole.

In an exemplary implementation mode, the first partition layer 60, the first inorganic layer 96 covering an outer surface of the first partition layer 60, a partition hole provided on the first inorganic layer 96, and the partition groove 61 provided on the first partition layer 60 form a first partition structure, which is formed in a partition region 51 surrounding the hole region 50 and is an annular partition structure surrounding the hole region 50.

In an exemplary implementation mode, the second partition layer 70, the second inorganic layer 97 covering the second partition layer 70, a partition hole provided on the second inorganic layer 97, and the partition groove 61 provided on the second partition layer 70 form a second partition structure, which is formed on the side of the first edge 311 away from the display region and is a linear partition structure extending along the first edge 311.

In an exemplary implementation mode, within the third opening K3 of the power supply line region 302, the first inorganic layer 96 in the first partition structure at the side of away from the hole region is lapped on the power supply line 310, and the second inorganic layer 97 in the second partition structure at the side of close to the display region is lapped on the power supply line 310.

In an exemplary implementation mode, a third width L3 of a part of the first inorganic layer 96 and the second inorganic layer 97 being lapped on the power supply line 310 can be greater than or equal to 2 μm, which improves the lapping effect between the power supply line 310 and the first inorganic layer 96 of the first partition layer and the second inorganic layer 97 of the second partition layer.

Because the edge 313 of the hole region of the power supply line 310 is covered by the first partition layer 60, and the first inorganic layer 96 covers the interface region between the first partition layer 60 and the power supply line 310, so that the edge of the hole region of the power supply line is covered by double layers, which can effectively prevent the peeling failure of the edge of the hole region of the power supply line. Because the first edge 311 of the power supply line 310 is covered by the second partition layer 70, and the second inorganic layer 97 on a side close to the display region covers the interface region between the second partition layer 70 and the power supply line 310, so that the first edge is covered by double layers, which can effectively prevent the peeling failure of the first edge of the power supply line.

Figure 10D:
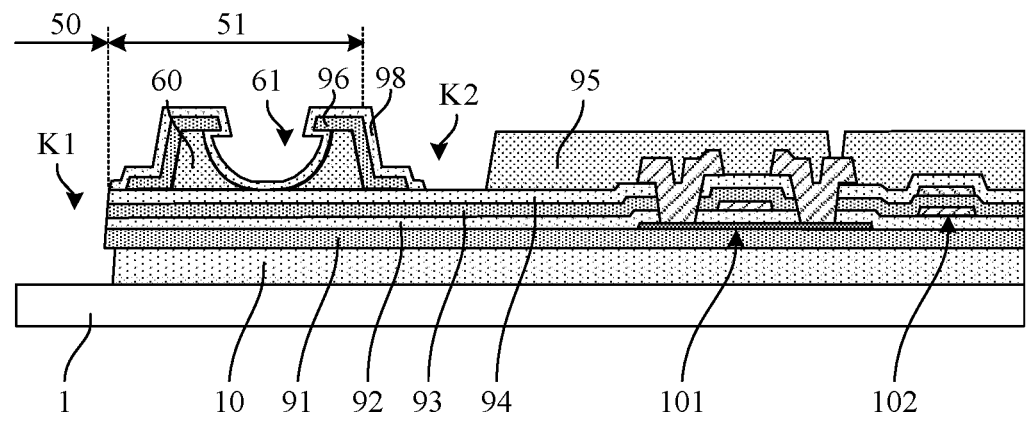
Figure 10E:
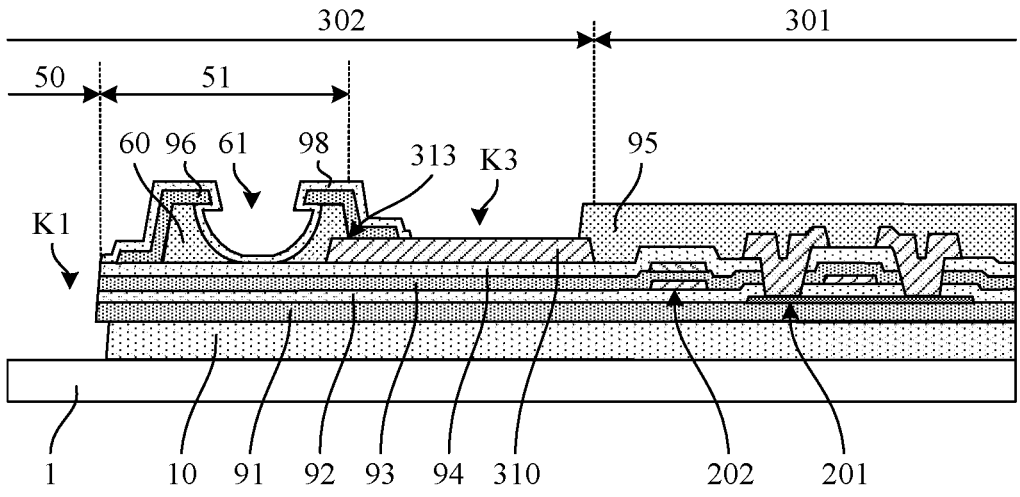
Figure 10F:
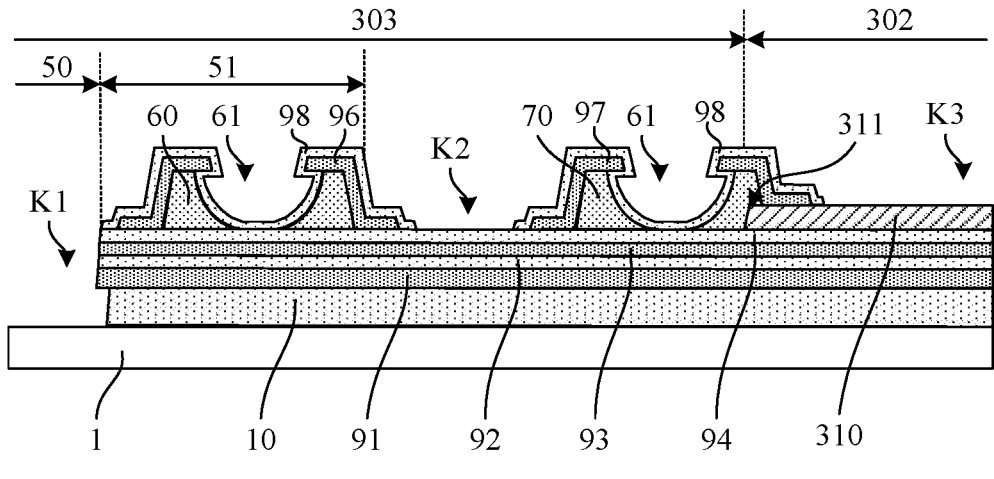

In an exemplary implementation mode, the first partition structure and the second partition structure may include a third inorganic layer. Forming a pattern of the third inorganic layer may include: depositing an inorganic material film on the base substrate on which the aforementioned patterns are formed, and patterning the inorganic material film by a patterning process to form a third inorganic layer 98 covering the first inorganic layer 96, the second inorganic layer 97, and the partition groove 61, as shown in FIGS. 10*d*, 10*e*, and 10*f*, wherein FIG. 10*d* is a cross-sectional view taken along a A-A direction in FIG. 3, FIG. 10*e* is a cross-sectional view taken along a B-B direction in FIG. 6, and FIG. 10*f* is a cross-sectional view taken along a C-C direction in FIG. 6.

In an exemplary implementation mode, the third inorganic layer 98 serves as the third cover layer of the present disclosure. In some possible exemplary implementation modes, the third cover layer may be made of a metallic material, which is not limited in the present disclosure.

In an exemplary implementation mode, in the display region, the circuit region 310, the power supply line region 302, and the edge region 303, the third inorganic layer 98 covers the first inorganic layer 96 and the second inorganic layer 97, and covers the inner wall of the partition groove 61, including covering the sidewall surface and the bottom surface of the partition groove 61. The completely covering the inner wall of the partition groove by the third inorganic layer 98 ensures the integrity of the partition structure, which can further ensure the partition effect of the partition structure.

In an exemplary implementation mode, the third inorganic layer 98 may only cover the first inorganic layer and the partition groove of the first partition structure, or the third inorganic layer 98 may only cover the second inorganic layer and the partition groove of the second partition structure, or the third inorganic layer 98 may simultaneously cover the first inorganic layer of the first partition structure, the second inorganic layer and the partition groove of the second partition structure.

After this process, the edge region 303 includes a base substrate 10, a composite insulation layer disposed on the base substrate 10, and a first partition structure disposed on the composite insulation layer. The edge region 303 is provided with a plurality of hole regions 50 penetrating through the base substrate 10 and the composite insulation layer, and the first partition structure is in a ring shape surrounding the hole regions 50.

Figure 11A:
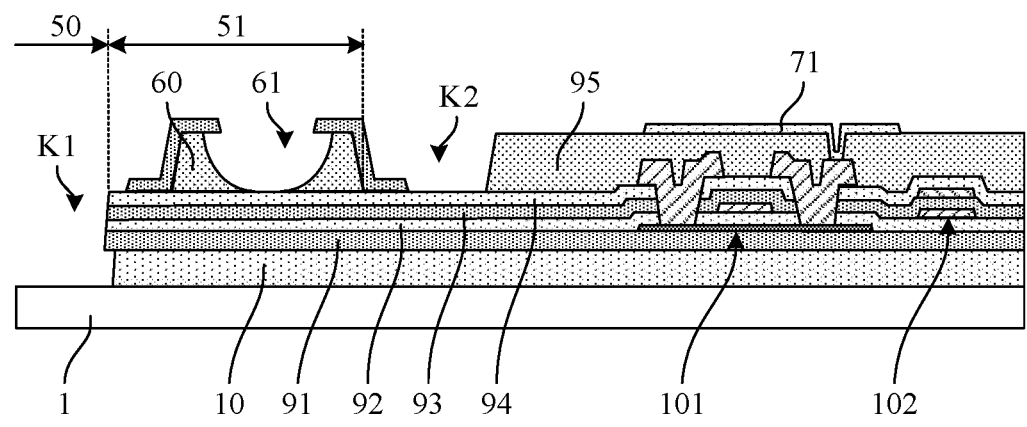
FIGS. 11a to 11c are schematic views after a pattern of a connection electrode is formed according to an embodiment of the present disclosure.
Figure 11B:
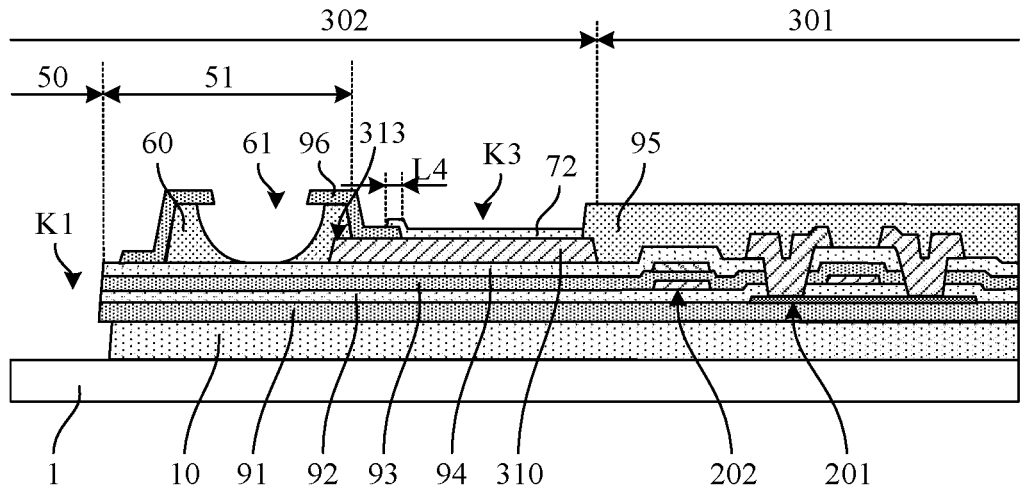
Figure 11C:
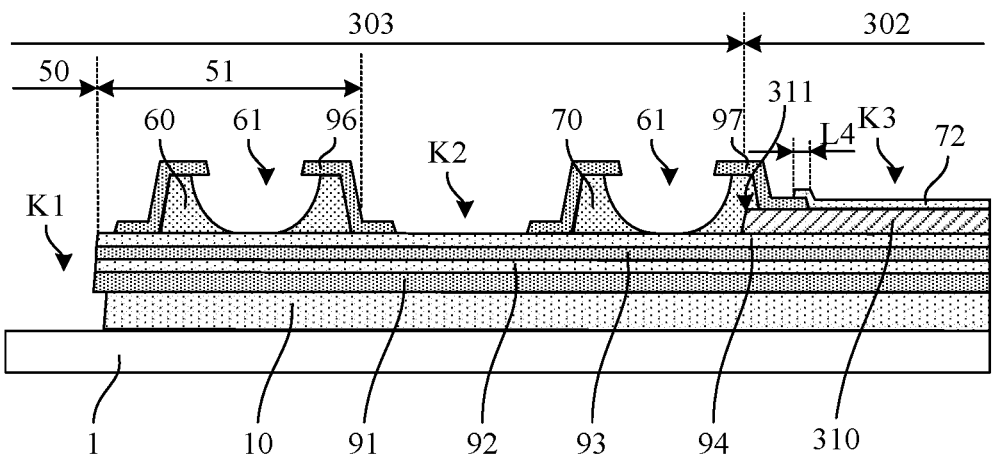

(15) Forming patterns of an anode and a connection electrode. In an exemplary implementation mode, forming the patterns of the anode and the connection electrode may include depositing a conductive film on the base substrate on which the aforementioned patterns are formed, patterning the conductive film by a patterning process to form patterns of an anode 71 and a connection electrode 72, as shown in FIGS. 11*a*, 11*b*, and 11*c*, wherein FIG. 11*a* is a cross-sectional view taken along a A-A direction in FIG. 3, FIG. 11*b* is a cross-sectional view taken along a B-B direction in FIG. 6, and FIG. 11*c* is a cross-sectional view taken along a C-C direction in FIG. 6.

In an exemplary implementation mode, the anode 71 is located on the planarization layer 95 of the display region and is connected to the first drain electrode of the first transistor 101 through an anode via. The connection electrode 72 is located in the third opening K3 of the power supply line region 302 and is lapped with the power supply line 310 exposed by the third opening K3, thereby achieving connection between the connection electrode 72 and the power supply line 310. In an exemplary implementation mode, the connection electrode 72 is configured to be connected to a subsequently formed cathode, which achieves a reliable connection of the cathode with the power supply line 310 through the connection electrode 72.

In an exemplary implementation mode, within the third opening K3 of the power supply line region 302, the orthographic projection of the connection electrode 72 on the plane of the display substrate and the orthographic projection of the first inorganic layer 96 on the plane of the display substrate have at least a partial overlap. A side of the connection electrode 72 close to the hole region 50 covers the edge of the first inorganic layer 96 on a side away from the hole region 50, and the first inorganic layer 96 is a first inorganic layer 96 lapped on the power supply line 310. Because the edge 313 of the hole region of the power supply line 310 is covered by the first partition layer 60, the first inorganic layer 96 covers the first partition layer 60, and the edge of the first inorganic layer 96 is covered by the connection electrode 72, so that the edge of the hole region of the power supply line and the edge of the first inorganic layer are sequentially covered, and the plurality of coverings formed can effectively prevent peeling failure of the edge of the hole region of the power supply line and the outer edge of the first partition structure.

In an exemplary implementation mode, within the third opening K3 of the power supply line region 302, the orthographic projection of the connection electrode 72 on the plane of the display substrate and the orthographic projection of the second inorganic layer 97 on the plane of the display substrate are at least partially overlapped. The side of the connection electrode 72 away from the display region covers an edge of the second inorganic layer 97 close to the display region, and the second inorganic layer 97 is a second inorganic layer 97 lapped on the power supply line 310. Because the first edge 311 of the power supply line 310 is covered by the second partition layer 70, the second inorganic layer 97 covers the second partition layer 70, and the edge of the second inorganic layer 97 is covered by the connection electrode 72, so that the first edge of the power supply line and the edge of the second inorganic layer are sequentially covered, and the plurality of covering formed can effectively prevent peeling failure of the first edge of the power supply line and the outer edge of the second partition structure.

In an exemplary implementation mode, the fourth width L4 of a part of the connection electrode 72 covering the first inorganic layer 96 and the second inorganic layer 97 may be designed according to actual needs, and the fourth width L4 may be greater than 0 but smaller than the third width L3. For example, the fourth width L4 may be about one-fourth to one-half of the third width L3.

In an exemplary implementation mode, the conductive thin film may be made of a metal material or a transparent conductive material, and the metal material may include any one or more of silver (Ag), copper (Cu), aluminum (Al), titanium (TI), and molybdenum (Mo), or an alloy material of the above metals, and the transparent conductive material may include Indium Tin Oxide (ITO) or Indium Zinc Oxide (IZO). In an exemplary implementation mode, the conductive thin film may have a single-layer structure or a multilayer composite structure, such as ITO/Al/ITO.

Figure 12A:
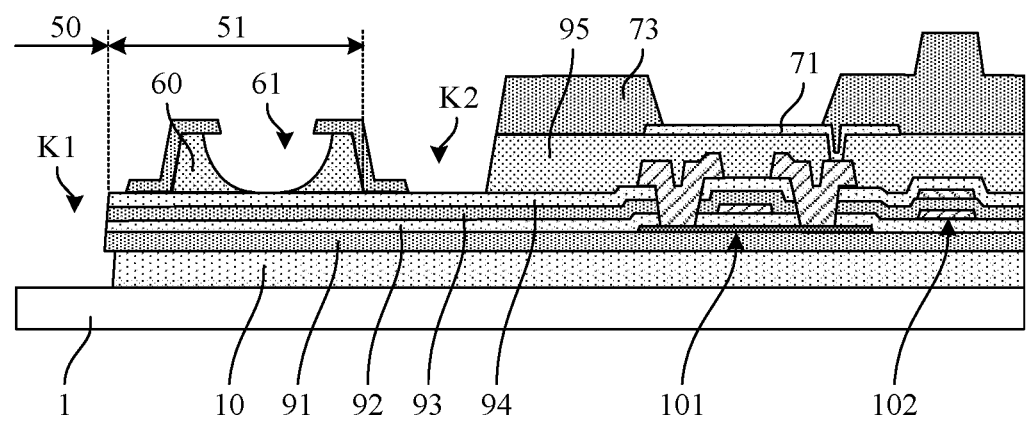
FIGS. 12a to 12c are schematic diagrams after a pattern of a partition dam is formed according to an embodiment of the present disclosure.
Figure 12B:
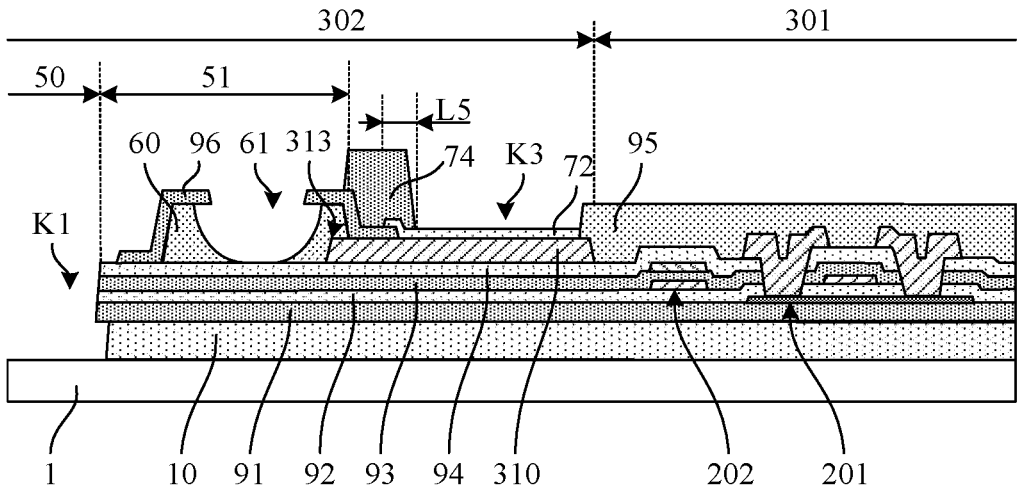
Figure 12C:
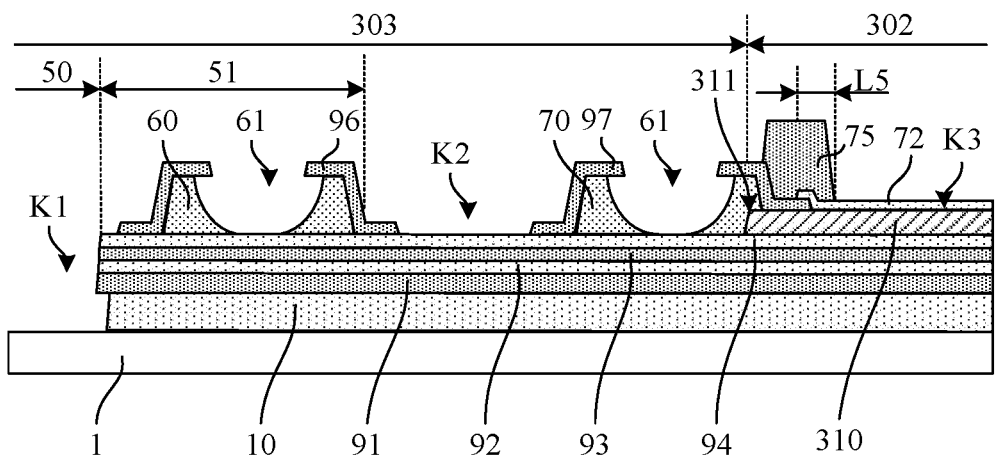

(16) Forming patterns of a pixel definition layer and a partition dam. In an exemplary implementation mode, forming the patterns of the pixel definition layer and the partition dam may include: coating a pixel definition film on the base substrate on which the aforementioned patterns are formed, and patterning the pixel definition film by a patterning process to form a pattern of a pixel definition layer 73, a first partition dam 74 and a second partition dam 75, as shown in FIGS. 12a, 12b and 12c, wherein FIG. 12a is a cross-sectional view taken along a A-A direction in FIG. 3, FIG. 12b is a cross-sectional view taken along a B-B direction in FIG. 6, and FIG. 12c is a cross-sectional view taken along a C-C direction in FIG. 6.

In an exemplary implementation mode, the pixel definition layer 73 is formed in the display region and is provided with a pixel opening, and the pixel definition layer in the pixel opening is removed to expose a surface of the anode 71. In an exemplary implementation mode, a pattern of a post spacer may be formed when the pixel definition layer is formed, and the post spacer is configured to support a mask in a subsequent evaporation process. In an exemplary implementation mode, the post spacer may be disposed on an outside of the pixel opening, and the patterns of the pixel definition layer and the post spacer may be formed through a same patterning process through a Half Tone Mask, which is not limited in the present disclosure.

In an exemplary implementation mode, the first partition dam 74 may be formed at the outer side of the first partition structure away from the hole region 50, as an annular dam body surrounding the first partition structure. The side of the first partition dam 74 close to the hole region 50 is provided on the first inorganic layer 96 on the side of the first partition structure away from the hole region 50, and the side of the first partition dam 74 away from the hole region 50 is provided on the connection electrode 72 and completely covers the edge of the connection electrode 72 on a side close to the hole region 50. In an exemplary implementation mode, the fifth width L5 of a part of the first partition dam 74 covering the connection electrode 72 may be greater than or equal to 1 μm, that is, the distance between the edge of the first partition dam 74 on a side away from the hole region and the edge of the connection electrode 72 on a side close to the hole region is greater than or equal to 1 μm, so that the edge of the connection electrode is completely covered by the first partition dam 74 and peeling failure of the edge of the connection electrode is prevented. By setting the fifth width L5, the first partition dam 74 can cover the edge of the connection electrode 72 on a side close to the hole region, or cover the edge of the first inorganic layer 96 on a side away from the hole region, or cover both the edge of the connection electrode 72 on a side close to the hole region and the edge of the first inorganic layer 96 on a side away from the hole region. In an exemplary implementation mode, the orthographic projection of the edge of the connection electrode 72 on a side close to the hole region on the base substrate is within the range of the orthographic projection of the first partition dam 74 on the base substrate, alternatively, the orthographic projection of the edge of the first inorganic layer 96 on a side away from the hole region on the base substrate is within the range of the orthographic projection of the first partition dam 74 on the base substrate, alternatively, the orthographic projection of the edge of the connection electrode 72 on a side close to the hole region on the base substrate and the orthographic projection of the edge of the first inorganic layer 96 on a side away from the hole region on the base substrate are both within the range of the orthographic projection of the first partition dam 74 on the base substrate. When the orthographic projection of the connection electrode 72 on the base substrate and the orthographic projection of the first inorganic layer 96 on the base substrate are at least partially overlapped, the partial overlap is within the range of the orthographic projection of the first partition dam 74 on the base substrate. Because the edge 313 of the hole region of the power supply line 310 is covered by the first partition layer 60, the first inorganic layer 96 covers the first partition layer 60, the edge of the first inorganic layer 96 is covered by the connection electrode 72, the edge of the connection electrode 72 is covered by the first partition dam 74, so that the edge of the hole region of the power supply line, the edge of the first inorganic layer and the edge of the connection electrode are sequentially covered, and the plurality of covering formed can effectively prevent the peeling failure of the edge of the hole region of the power supply line, the edge of the first inorganic layer and the edge of the connection electrode.

In an exemplary implementation mode, the first partition dam may be disposed in the power supply line region to enable a plurality of covering for the edge of a film layer. In some possible exemplary implementation modes, the first partition dam may be disposed in the display region, the circuit region, the power supply line region, and the edge region to improve the partition effect of the first partition structure in the display region, the circuit region, and the edge region while achieving a plurality of covering for the edge of the film layer of the power supply line region.

In an exemplary implementation mode, the first partition dam may be disposed on a side of the partition groove away from the hole region, where the first partition structure including the first partition dam has different heights on the inner side close to the hole region and the outer side away from the hole region. The distance between the top surface of the first partition structure away from the outer side of the hole region (the surface of the first partition dam on a side away from the base substrate) and the base substrate is greater than the distance between the top surface of the first partition structure close to the inside of the hole region (the surface of the first inorganic layer on a side away from the base substrate) and the base substrate.

In an exemplary implementation mode, the first partition dam may be disposed both on a side of the partition groove close to the hole region and on a side away from the hole region to form two annular dam bodies surrounding the hole region 50.

In an exemplary implementation mode, the second partition dam 75 may be formed on a side of the second partition structure close to the display region, as a linear dam body extending along the first edge 311. The side of the second partition dam 75 away from the display region is provided on the second inorganic layer 97 on a side of the second partition structure close to the display region, and the side of the second partition dam 75 close to the display region is provided on the connection electrode 72 and completely covers the edge of the connection electrode 72 on a side away from the display region. In an exemplary implementation mode, the fifth width L5 of the part of the second partition dam 75 covering the connection electrode 72 may be greater than or equal to 1 μm, that is, the distance between the edge of the second partition dam 75 on a side close to the display region and the edge of the connection electrode 72 on a side away from the display region is greater than or equal to 1 μm, so that the edge of the connection electrode is completely covered by the second partition dam 75 and peeling failure of the edge of the connection electrode is prevented. By setting the fifth width L5, the second partition dam 75 can cover the edge of the connection electrode 72 on a side away from the display region, or cover the edge of the second inorganic layer 97 on a side close to the display region, or cover both the edge of the connection electrode 72 on a side away from the display region and the edge of the second inorganic layer 97 on a side close to the display region. In an exemplary implementation mode, the ortho-graphic projection of the edge of the connection electrode 72 on a side away from the display region on the base substrate is within the range of the orthographic projection of the second partition dam 75 on the base substrate, alternatively, the orthographic projection of the edge of the second inor-ganic layer 97 on a side close to the display region on the base substrate is within the range of the orthographic pro-jection of the second partition dam 75 on the base substrate, alternatively, the orthographic projection of the edge of the connection electrode 72 on a side away from the display region on the base substrate and the orthographic projection of the edge of the second inorganic layer 97 on a side close to the display region on the base substrate are both within the range of the orthographic projection of the second partition dam 75 on the base substrate. When the orthographic projection of the connection electrode 72 on the base sub-strate and the orthographic projection of the second inor-ganic layer 97 on the base substrate have at least a partial overlap, the partial overlap is within the range of the orthographic projection of the second partition dam 75 on the base substrate. Because the first edge 311 of the power supply line 310 is covered by the second partition layer 70, the second inorganic layer 97 covers the second partition layer 70, the edge of the second inorganic layer 97 is covered by the connection electrode 72, the edge of the connection electrode 72 is covered by the second partition dam 75, so that the first edge of the power supply line, the edge of the second inorganic layer and the edge of the connection electrode are sequentially covered, and the plurality of covering formed can effectively prevent peeling failure of the first edge of the power supply line, the edge of the second inorganic layer and the edge of the connection electrode.

In an exemplary implementation mode, the second parti-tion dam may be disposed on a side of the second partition structure close to the display region, to achieve a plurality of covering for the edge of the film layer. At this time, the second partition structures including the second partition dams have different heights. In some possible implementa-tion modes, the second partition dam may be simultaneously disposed on a side of the second partition structure close to the display region and a side away from the display region to form two linear dam bodies extending along the first edge to improve the partition effect of the second partition struc-ture while achieving a plurality of covering for the edge of the film layer.

In an exemplary implementation mode, the pixel defini-tion layer may be made of polyimide, acrylic, polyethylene terephthalate, or the like. In a plane parallel to the display substrate, a shape of the pixel opening may be a triangle, a rectangle, a polygon, a circle, an ellipse, or the like. In a plane perpendicular to the display substrate, the cross-sectional shape of the pixel opening may be rectangular, trapezoidal or the like, and the cross-sectional shape of the first partition dam 74 and the second partition dam 75 may be in a shape of a trapezoid, and the width of the partition dam on a side away from the base substrate is smaller than the width of the partition dam on a side close to the base substrate.

Figure 13A:
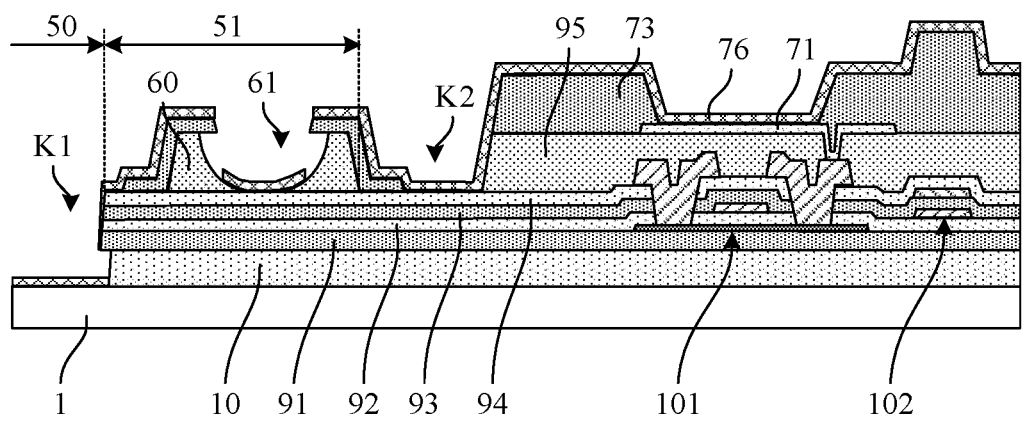
FIGS. 13a to 13c are schematic views after a pattern of an organic light emitting layer is formed according to an embodiment of the present disclosure.
Figure 13B:
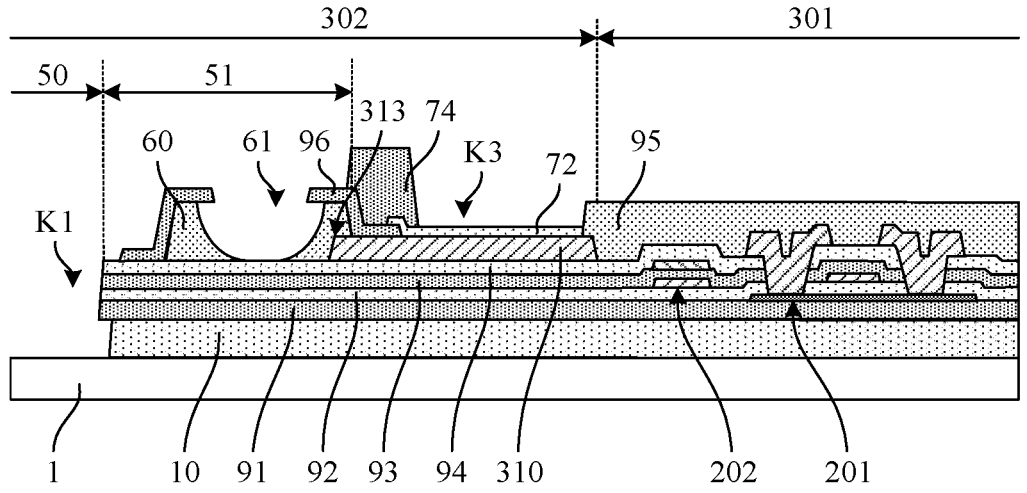
Figure 13C:
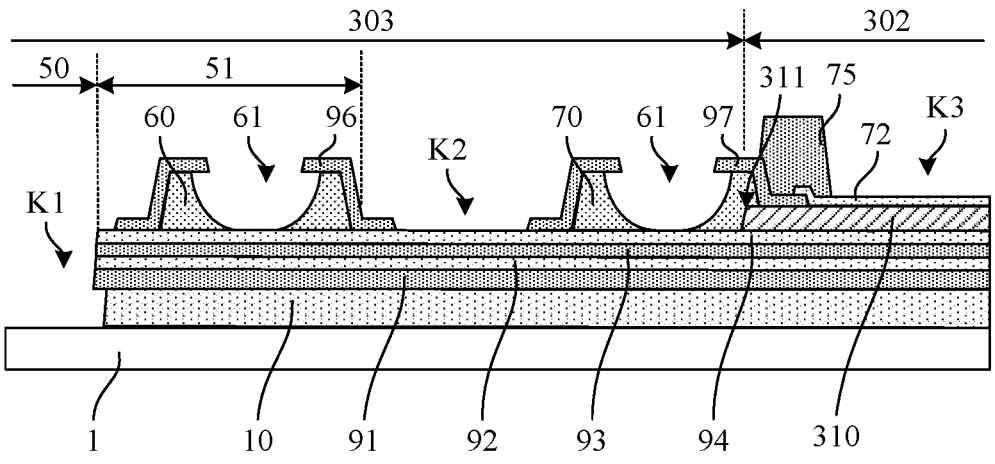

(17) Forming a pattern of an organic emitting layer. In an exemplary implementation mode, forming the pattern of the organic emitting layer may include forming a pattern of the organic light emitting layer 76 by evaporation or ink-jet printing on the base substrate on which the aforementioned patterns are formed, as shown in FIGS. 13a, 13b and 13c, wherein FIG. 13a is a cross-sectional view taken along a A-A direction in FIG. 3, FIG. 13b is a cross-sectional view taken along a B-B direction in FIG. 6, and FIG. 13c is a cross-sectional view taken along a C-C direction in FIG. 6.

In an exemplary implementation mode, the organic light emitting layer 76 can be formed only in the display region and is connected to the anode 71 through a pixel opening.

In an exemplary implementation mode, because the par-tition groove 61 has a side erosion structure, and the first inorganic layer 96 and the second inorganic layer 97 have an "eave" structure protruding from the upper opening of the partition groove 61, thus the organic light emitting layer 76 in the display region is disconnected at the "eave" structure of the partition groove 61, and an organic light emitting block is formed at the bottom of the partition groove 61, and the organic light emitting block and the organic light emit-ting layer 76 are disposed in isolation from each other. In the present disclosure, by arranging the partition groove, the organic emitting layer is disconnected, which may cut off a transmission channel of water and oxygen and effectively block invasion of the water and oxygen from the hole region.

In an exemplary implementation mode, because the com-posite insulation layer of the inner wall of the hole region 50 has an "eave" structure protruding from the base substrate, the organic light emitting layer 76 in the display region is disconnected at the "eave" structure of the hole region 50, and an organic light emitting block is formed on the glass carrier plate 1 at the bottom of the hole region 50, and the organic light emitting block and the organic light emitting layer 76 are disposed in isolation from each other. In the present disclosure, the organic light emitting block is formed at the bottom of the hole region of the display region, so that an inorganic encapsulation layer formed subsequently is formed on the organic emitting blocks. Because the organic emitting material is easily separated from the glass substrate, a situation that a film layer cannot be lifted off during a lifting process of the display substrate from a glass carrier plate is effectively avoided.

In an exemplary implementation mode, by the design of the mask, the organic light emitting layer 76 may be formed only in the display region, or may be formed in the display region and in any one or more of the circuit region 301, the power supply line region 302 and the edge region 303 such that organic light emitting blocks are formed at the bottom of the partition groove and the bottom of the hole region in these regions.

In an exemplary implementation mode, the organic emitting layer may include an Emitting Layer (EML), and any one or more of following: a Hole Injection Layer (HIL), a Hole Transport Layer (HTL), an Electron Block Layer (EBL), a Hole Block Layer (HBL), an Electron Transport Layer (ETL), and an Electron Injection Layer (EIL). In an exemplary implementation mode, the organic emitting layer may be prepared and formed through evaporation using a Fine Metal Mask (FMM) or an open mask, or prepared and formed using an ink-jet process.

In an exemplary implementation mode, the organic emitting layer may be prepared through a following preparation method. First, a hole injection layer and a hole transport layer are sequentially evaporated by using an open mask, and a common layer of the hole injection layer and the hole transport layer is formed on the display substrate. Then, by using a fine metal mask, an electron block layer and a red emitting layer are evaporated in a red sub-pixel, an electron block layer and a green emitting layer are evaporated in a green sub-pixel, and an electron block layer and a blue emitting layer are evaporated in a blue sub-pixel. Electron block layers and emitting layers of adjacent sub-pixels may be overlapped slightly (for example, an overlapping portion accounts for less than 10% of an area of a pattern of a respective emitting layer), or may be isolated. Then, a hole block layer, an electron transport layer, and an electron injection layer are sequentially evaporated by using an open mask, and a common layer of the hole block layer, the electron transport layer, and the electron injection layer is formed on the display substrate.

In an exemplary implementation mode, an electron block layer may be used as a micro-cavity adjustment layer of a light emitting device. By designing a thickness of an electron block layer, a thickness of an organic emitting layer between a cathode and an anode may satisfy a design for a length of a micro-cavity. In some exemplary implementation modes, a hole transport layer, a hole block layer, or an electron transport layer in an organic emitting layer may be used as a micro-cavity adjustment layer of a light emitting device, which is not limited in the present disclosure.

In an exemplary implementation mode, an emitting layer may include a host material and a dopant material doped into the host material. A doping ratio of the dopant material of the emitting layer is 1% to 20%. Within a range of the doping ratio, on one hand, the host material of the emitting layer may effectively transfer exciton energy to excite the dopant material of the emitting layer to excite the dopant material of the emitting layer to emit light; on the other hand, the host material of the emitting layer "dilutes" the dopant material of the emitting layer, thus effectively improving fluorescence quenching caused by collisions between molecules of the dopant material of the emitting layer and collisions between energies, and improving a luminous efficiency and device life. In an exemplary implementation mode, the doping ratio refers to a ratio of a mass of the dopant material to a mass of the emitting layer, that is, a mass percentage. In an exemplary implementation mode, the host material and the dopant material may be co-evaporated through a multi-source evaporation process, so that the host material and the dopant material are uniformly dispersed in the emitting layer. A doping ratio may be adjusted by controlling an evaporation rate of the dopant material or by controlling an evaporation rate ratio of the host material to the dopant material during an evaporation process. In an exemplary implementation mode, a thickness of the emitting layer may be about 10 nm to 50 nm.

In an exemplary implementation mode, a hole injection layer may be made of an inorganic oxide, such as molybdenum oxide, titanium oxide, vanadium oxide, rhenium oxide, ruthenium oxide, chromium oxide, zirconium oxide, hafnium oxide, tantalum oxide, silver oxide, tungsten oxide, or manganese oxide, or may be made of a p-type dopant of a strongly electron withdrawing system and a dopant of a hole transport material. In an exemplary implementation mode, a thickness of the hole injection layer may be about 5 nm to 20 nm.

In an exemplary implementation mode, a hole transport layer may be made of a material with a relatively high hole mobility, such as an aromatic amine compound, and its substituent group may be carbazole, methylfluorene, spiro-fluorene, dibenzothiophene, or furan. In an exemplary implementation mode, a thickness of the hole transport layer may be about 40 nm to 150 nm.

In an exemplary implementation mode, a hole block layer and an electron transport layer may be made of aromatic heterocyclic compounds, such as benzimidazole derivatives, imidazopyridine derivatives, benzimidazophenanthridine derivatives, and other imidazole derivatives; pyrimidine derivatives, triazine derivatives, and other azine derivatives; quinoline derivatives, isoquinoline derivatives, phenanthroline derivatives, and other compounds containing a nitrogen-containing six-membered ring structure (also including compounds having a phosphine oxide-based substituent on a heterocyclic ring). In an exemplary implementation mode, a thickness of the hole block layer may be about 5 nm to 15 nm, and a thickness of the electron transport layer may be about 20 nm to 50 nm.

In an exemplary implementation mode, an electron injection layer may be made of an alkali metal or a metal, such as lithium fluoride (LiF), ytterbium (Yb), magnesium (Mg), or Calcium (Ca), or a compound of these alkali metals or metals. In an exemplary implementation mode, a thickness of the electron injection layer may be about 0.5 nm to 2 nm.

Figure 14A:
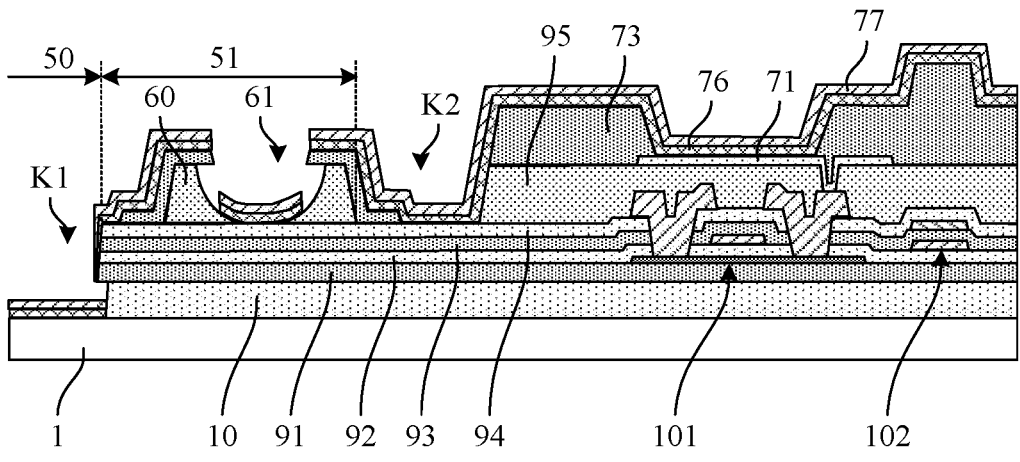
FIGS. 14a to 14c are schematic views after a pattern of a cathode is formed according to an embodiment of the present disclosure.
Figure 14B:
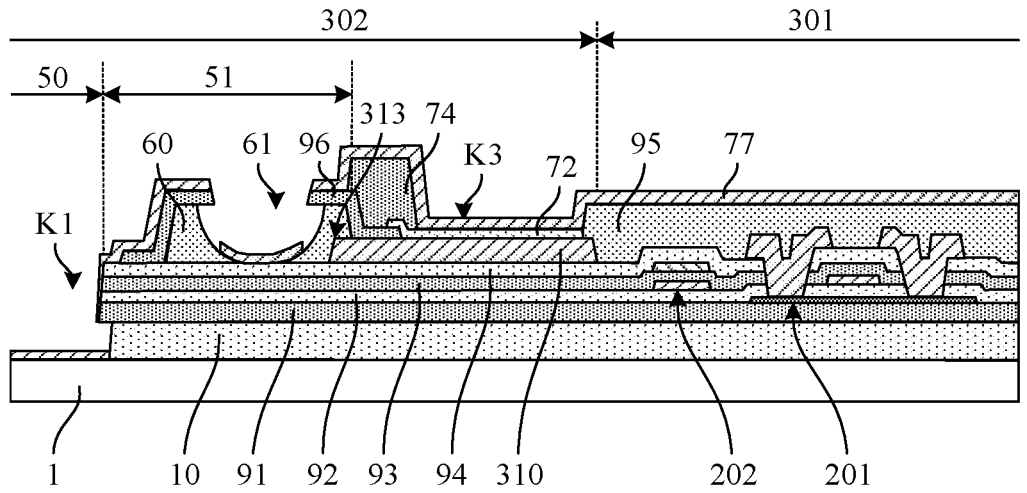
Figure 14C:
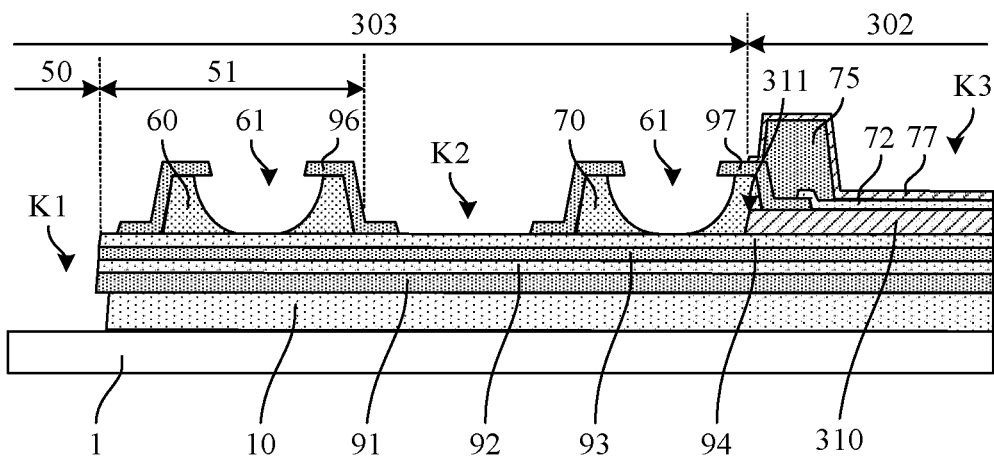

(18) Forming a pattern of a cathode. In an exemplary implementation mode, forming a pattern of a cathode may include forming a pattern of a cathode 77 by evaporation on the base substrate on which the aforementioned patterns are formed, as shown in FIGS. 14a, 14b, and 14c, wherein FIG. 14a is a cross-sectional view taken along a A-A direction in FIG. 3, FIG. 14b is a cross-sectional view taken along a B-B direction in FIG. 6, and FIG. 14c is a cross-sectional view taken along a C-C direction in FIG. 6. In an exemplary implementation mode, the cathode may be made of any one or more of magnesium (Mg), silver (Ag), aluminum (Al), copper (Cu), and lithium (Li), or an alloy made of any one or more of the above metals.

In an exemplary implementation mode, the stretchable cathode 77 may be formed in the display region, the circuit region 301 and the power supply line region 302, and may be an integral structure communicated together. The cathode 77 of the display region is connected with the organic light emitting layer 76 so that the organic light emitting layer 76 is connected with the anode 71 and the cathode 77 at the same time. The cathode 77 of the power supply line region 302 is connected with the connection electrode 72 exposed by the third opening K3. Because the power supply line 310 is connected to the connection electrode 72 and the connection electrode 72 is connected to the cathode 77, the connection between the cathode 77 and the power supply line 310 is achieved.

In an exemplary implementation mode, because the partition groove 61 has a side erosion structure and the first inorganic layer 96 and the second inorganic layer 97 have a "eave" structure protruding from the upper opening of the partition groove 61, the cathodes 77 in the display region, the circuit region 301 and the power supply line region 302 are disconnected at the "eave" structure of the partition groove 61, and a cathode block is formed at the bottom of the partition groove 61, and the cathode block and the cathode 77 are disposed in isolation from each other.

In an exemplary implementation mode, because the composite insulation layer of the inner wall of the hole region 50 has a "eave" structure protruding from the base substrate, the cathodes 77 in the display region, the circuit region 301, and the power supply line region 302 are disconnected at the "eave" structure of the hole region 50, and a cathode block is formed on the glass carrier plate 1 at the bottom of the hole region 50, and the cathode block and the cathode 77 are disposed in isolation from each other. In the present disclosure, the cathode is disconnected by arranging the partition groove, which may cut off a transmission channel of water and oxygen and effectively block invasion of the water and oxygen from the hole region.

In an exemplary implementation mode, in the display region, the cathode block is disposed on the organic light emitting block at the bottom of the partition groove 61 and at the bottom of the hole region 50. In the circuit region 301 and the power supply line region 302, the cathode block is disposed on the glass substrate 1 at the bottom of the partition groove 61 and at the bottom of the hole region 50. In the present disclosure, the cathode block is formed at the bottom of the hole region of the circuit region and the power supply line region, so that the inorganic encapsulation layer formed subsequently is formed on the cathode block. Because the cathode block formed by evaporation is easily separated from the glass substrate, a situation that a film layer cannot be lifted off during a lifting process of the display substrate from a glass carrier plate is effectively avoided.

In an exemplary implementation mode, in the power supply line region 302, the cathode 77 of an integral structure completely covers the first partition dam 74 and the second partition dam 75. Because the edge 313 of the hole region of the power supply line 310 is covered by the first partition layer 60, the first inorganic layer 96 covers the first partition layer 60, the edge of the first inorganic layer 96 is covered by the connection electrode 72, the edge of the connection electrode 72 is covered by the first partition dam 74, the first partition dam 74 is completely covered by the cathode 77, so that the edge of the hole region of the power supply line, the edge of the first inorganic layer, the edge of the connection electrode and the first partition dam are sequentially covered, and the plurality of coverings formed can further prevent the peeling failure of the edge of the hole region of the power supply line, the edge of the first inorganic layer and the edge of the connection electrode, and ensure the smoothness of the surface of the structure. Because the first edge 311 of the power supply line 310 is covered by the second partition layer 70, the second inorganic layer 97 covers the second partition layer the edge of the second inorganic layer 97 is covered by the connection electrode 72, the edge of the connection electrode 72 is covered by the second partition dam 75, the second partition dam 75 is completely covered by the cathode 77, so that the first edge of the power supply line, the edge of the second inorganic layer, the edge of the connection electrode and the second partition dam are sequentially covered, and the plurality of coverings formed can further prevent the peeling failure of the first edge of the power supply line, the edge of the second inorganic layer and the edge of the connection electrode, and ensure the smoothness of the surface of the structure.

In an exemplary implementation mode, the cathode may be formed at the edge region 303 by the design of the mask such that the cathode block is formed at the bottom of the partition groove and at the bottom of the hole region of the edge region.

Figure 15A:
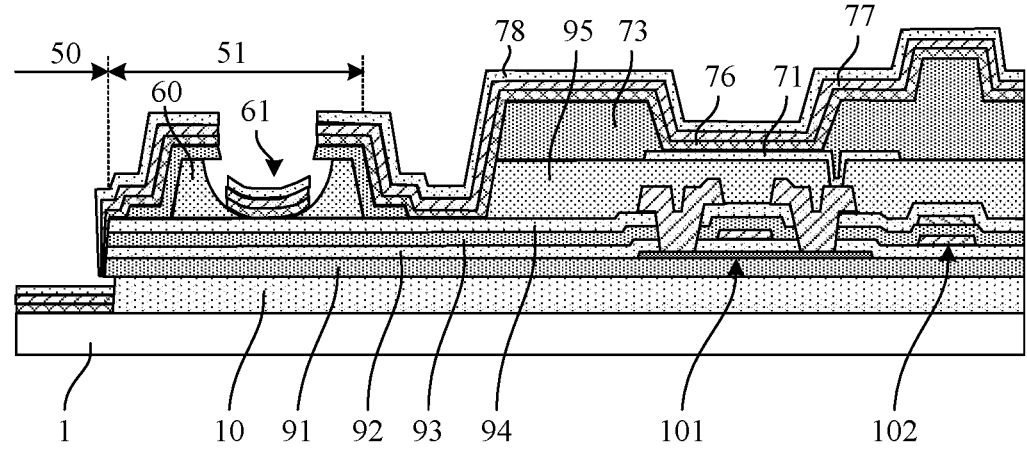
FIGS. 15a to 15c are schematic views after a pattern of an optical coupling layer is formed according to an embodiment of the present disclosure.
Figure 15B:
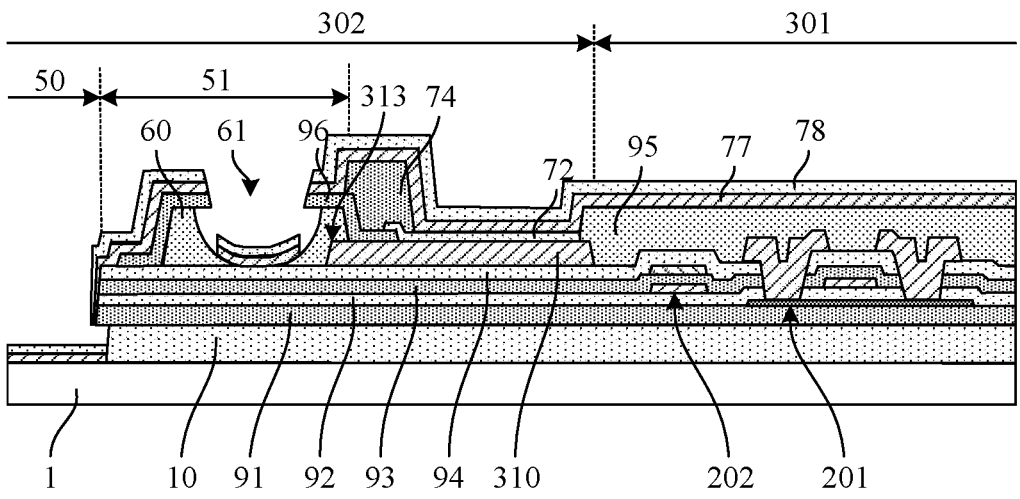
Figure 15C:
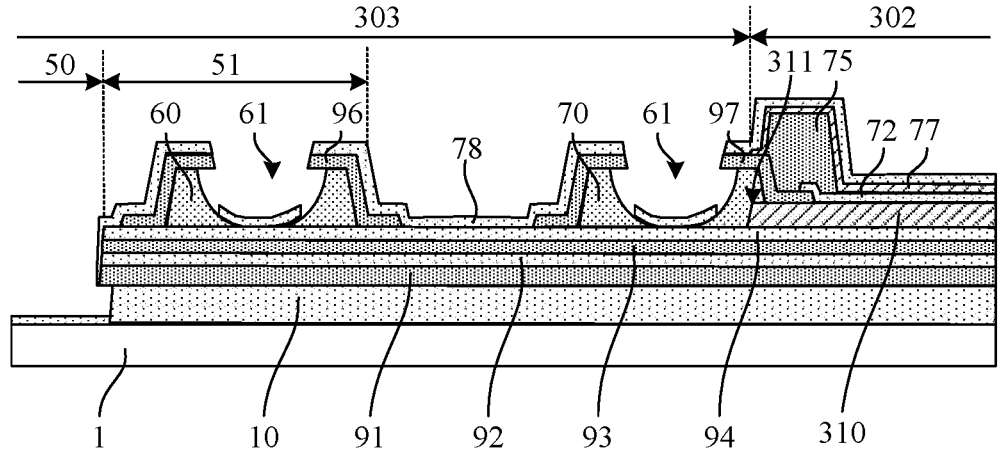

(19) Forming a pattern of an optical coupling layer. In an exemplary implementation mode, forming the pattern of the optical coupling layer may include forming the pattern of the optical coupling layer 78 by evaporation on the base substrate on which the aforementioned patterns are formed, as shown in FIGS. 15a, 15b, and 15c, wherein FIG. 15a is a cross-sectional view taken along a A-A direction in FIG. 3, FIG. 15b is a cross-sectional view taken along a B-B direction in FIG. 6, and FIG. 15c is a cross-sectional view taken along a C-C direction in FIG. 6.

In an exemplary implementation mode, the optical coupling layer 78 may be formed in the display region, the circuit region 301, the power supply line region 302 and the edge region 303 and may be an integral structure communicated together. In the display region, the circuit region 301 and the power supply line region 302, the optical coupling layer 78 is provided on the cathode 77, and in the edge region 303, the optical coupling layer 78 is provided on the composite insulation layer and the first partition structure.

In an exemplary implementation mode, because the partition groove 61 has a side erosion structure, and the first inorganic layer 96 and the second inorganic layer 97 have a "eave" structure protruding from the upper opening of the partition groove 61, the optical coupling layer 78 is disconnected at the "eave" structure of the partition groove 61, and an optical coupling block is formed at the bottom of the partition groove 61, and the optical coupling block and the optical coupling layer 78 are disposed in isolation from each other.

In an exemplary implementation mode, because the composite insulation layer of the inner wall of the hole region 50 has an "eave" structure protruding from the base substrate, the optical coupling layer 78 is disconnected at the "eave" structure of the hole region 50, and an optical coupling block is formed on the glass carrier plate 1 at the bottom of the hole region 50, and the optical coupling block and the optical coupling layer 78 are disposed in isolation from each other. In the present disclosure, the optical coupling block is disconnected by arranging the partition groove, which may cut off a transmission channel of water and oxygen and effectively block invasion of the water and oxygen from the hole region.

In an exemplary implementation mode, in the display region, the circuit region 301 and the power supply line region 302, the optical coupling block is disposed on the cathode block at the bottom of the partition groove 61 and the hole region 50. In the edge region 303, the optical coupling block is disposed on the glass substrate 1 at the bottom of the partition groove 61 and at the bottom of the hole region 50. In the present disclosure, the optical coupling block is formed at the bottom of the hole region of the edge region, so that the inorganic encapsulation layer formed subsequently is formed on the optical coupling block. Because the optical coupling block formed by evaporation is easily separated from the glass substrate, a situation that a film layer cannot be lifted off during a lifting process of the display substrate from a glass carrier plate is effectively avoided.

In an exemplary implementation mode, the optical coupling layer of the edge region covers the edge of the first inorganic layer on a side away from the hole region, which, to a certain extent, can prevent peeling failure of the edge of the first inorganic layer of the edge region.

In an exemplary implementation mode, a refractive index of the optical coupling layer may be greater than that of the cathode, which facilitates light extraction and increases light exiting efficiency. A material of the optical coupling layer may be an organic material, an inorganic material, or an organic material and an inorganic material, and may be a single layer, a multi-layer, or a composite layer, which is not limited in the present disclosure.

In an exemplary implementation mode, when a light wave (an electromagnetic wave) is incident on the interface between a metal and a dielectric, the free electrons on the surface of the metal oscillate collectively, a near-field electromagnetic wave propagating along the surface of the metal is formed by coupling the electromagnetic wave with the free electrons on the surface of the metal, if an oscillation frequency of the electrons coincides with a frequency of the incident light wave, resonance occurs. In a resonance state, energy of an electromagnetic field is effectively converted into collective vibration energy of the free electrons on the surface of the metal, and a special electromagnetic mode is formed at this time: the electromagnetic field is confined to a small range on the surface of the metal and is enhanced, and such phenomenon is referred to as a Surface Plasmon Polariton (SPP) effect, which will result in reduced efficiency of the exiting light. By arranging the optical coupling layer, the exemplary embodiment of the present disclosure can effectively reduce the surface plasmon polariton phenomenon to reduce the light loss, effectively improve the coupling light exiting efficiency inside the light emitting device, and be more conducive to exerting the light output characteristics of the device. In addition, because the cathode has a semi-transmitting and semi-reflecting effect on the emergent light, an optical coupling layer is disposed on the cathode, thus effectively adjusting the reflectivity and transmittance of the emergent light, effectively adjusting the length of the optical micro resonant cavity, and improving the emergent light intensity.

So far, the preparation of the light emitting structure layer is completed. In the display region, the light emitting structure layer includes an anode 71, an organic light emitting layer 76, a cathode 77, and an optical coupling layer 78, and the organic light emitting layer 76 is disposed between the anode 71 and the cathode 77.

Figure 16A:
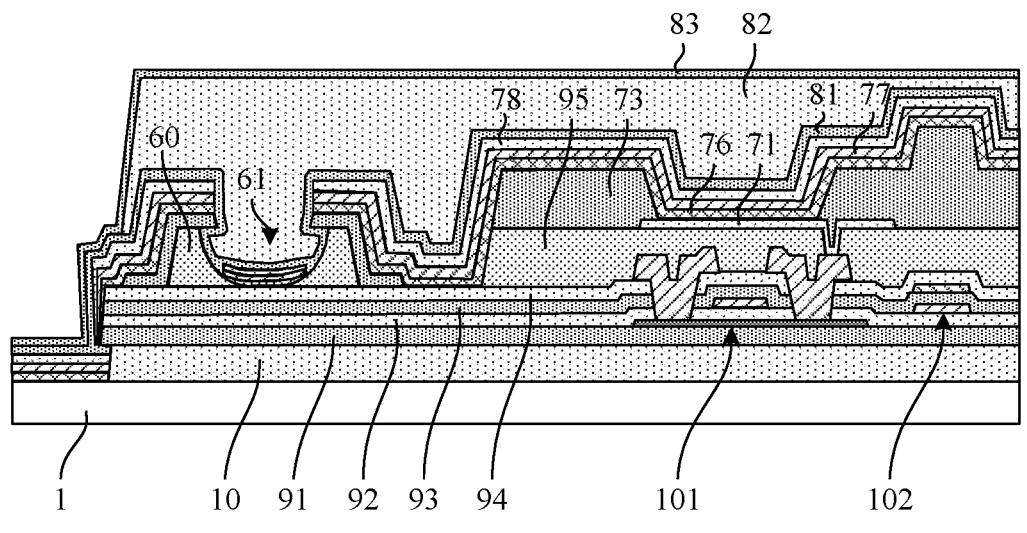
FIGS. 16a to 16c are schematic views after a pattern of an encapsulation layer is formed according to an embodiment of the present disclosure.
Figure 16B:
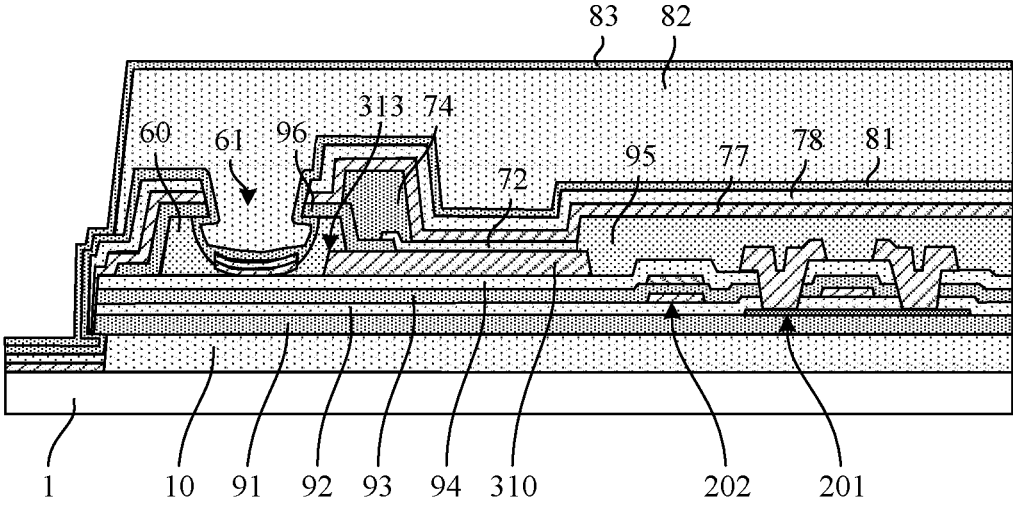
Figure 16C:
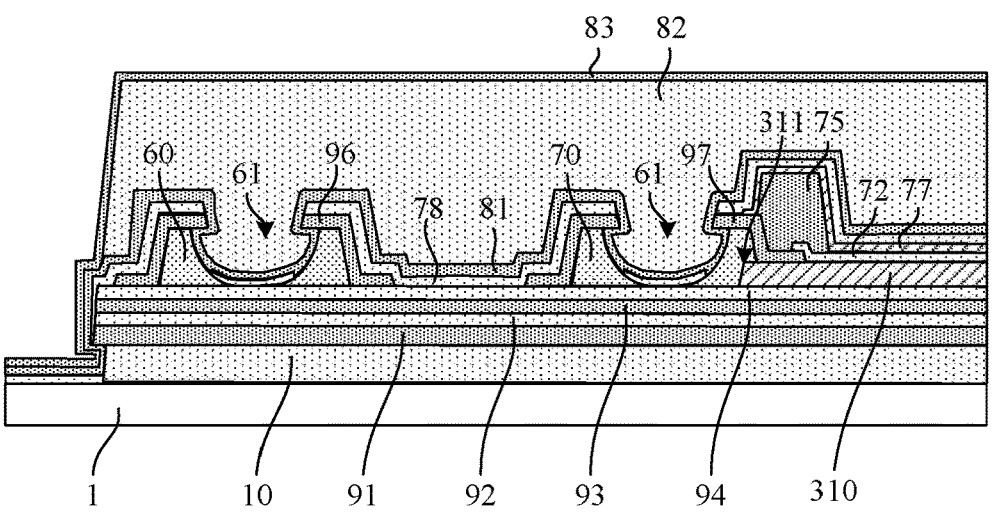

(20) Form a pattern of an encapsulation layer. In an exemplary implementation mode, forming the pattern of the encapsulation layer may include depositing a first inorganic encapsulation film in a deposition manner using an open mask on the base substrate on which the aforementioned patterns are formed, and forming a first encapsulation layer 81 in the display region, the circuit region 301, the power supply line region 302, and the edge region 303. Subsequently, an organic encapsulation material is printed by an ink-jet printing process, patterned, removed from the hole region and from the vicinity of the hole region, and cured into a film, and an second encapsulation layer 82 is formed in the display region, the circuit region 301, the power supply line region 302, and the edge region 303. Subsequently, a second inorganic encapsulation film is deposited using an open mask in a deposition manner, and a third encapsulation layer 83 is formed in the display region, the circuit region 301, the power supply line region 302, and the edge region 303, as shown in FIGS. 16*a*, 16*b*, and 16*c*, wherein FIG. 16*a* is a cross-sectional view taken along a A-A direction in FIG. 3, FIG. 16*b* is a cross-sectional view taken along a B-B direction in FIG. 6, and FIG. 16*c* is a cross-sectional view taken along a C-C direction in FIG. 6.

In an exemplary implementation mode, in the display region, the circuit region 310, the power supply line region 302, and the edge region 303, the first encapsulation layer 81 is disposed on the optical coupling layer 78 and covers the inner walls of the partition groove 61 and the hole region 50, and covers the optical coupling block at the bottom of the partition groove 61 and the hole region 50. The first encapsulation layer 81 completely covers the hole region and the partition groove, which ensures encapsulation integrity, not only effectively isolates water and oxygen from the hole region, but also forms a pinning point on the encapsulation layer by the partition groove, which may further prevent peeling failure of an edge of a film layer. The second encapsulation layer 82 is provided on the first encapsulation layer 81 and completely fills the partition groove 61, and the second encapsulation layer 82 in the hole region and the region close to the hole region is removed to expose the surface of the first encapsulation layer 81. The third encapsulation layer 83 is provided on the second encapsulation layer 82 in a region other than the hole region to form a laminated structure of an inorganic material/organic material/inorganic material, and the third encapsulation layer 83 is provided on the first encapsulation layer 81 in the hole region and the region close to the hole region to form a laminated structure of an inorganic material/inorganic material. The laminated structure of the inorganic material/organic material/inorganic material in the region outside the hole region can ensure effective encapsulation, and the laminated structure of the inorganic material/inorganic material in the hole region and the region close to the hole region can further ensure encapsulation integrity and effectively isolate water and oxygen from the hole region.

In an exemplary embodiment, the first encapsulation film may be made of any one or more of following: Silicon Oxide (SiOx), Silicon Nitride (SiNx), and Silicon Oxynitride (SiON), and may be a single layer, a multi-layer, or a composite layer, which may ensure that external water and oxygen cannot enter the light emitting structure layer. The organic encapsulation material may be made of a resin material, which plays a role of covering each film layer of the display substrate, so as to improve structural stability and planarization.

In an exemplary implementation mode, the first encapsulation layer and the second encapsulation layer form an encapsulation layer. In an exemplary implementation mode, after preparation of an encapsulation layer is completed, a touch structure layer (TSP) may be formed on the encapsulation layer, and the touch structure layer may include a touch electrode layer, or include a touch electrode layer and a touch insulation layer, which is not limited in the present disclosure.

In the subsequent process, the hole region can be etched by patterning process, and the film layer at the bottom of the hole region can be etched off to form a through hole. Because the etching process is essentially carried out along the surface of the first encapsulation layer covering the inner wall of the through hole, the final etched inner wall of the through hole may include a base substrate segment, an organic material segment, and an inorganic material segment, and the base substrate segment, the organic material segment, and the inorganic material segment are arranged in a direction from the base substrate to the first encapsulation layer.

In an exemplary implementation mode, in the inner wall of the hole region of the display region, the base substrate segment may include an inner wall formed of a first flexible material layer, a first inorganic material layer, a second flexible material layer, and a second inorganic material layer, the organic material segment may include an inner wall formed of an organic material block, a cathode block, and an optical coupling block, and the inorganic material segment may be an inner wall formed of the first encapsulation layer.

In an exemplary implementation mode, in the inner wall of the hole region of the circuit region and the power supply line region, the base substrate segment may include an inner wall formed by a first flexible material layer, a first inorganic material layer, a second flexible material layer, and a second inorganic material layer, the organic material segment may include an inner wall formed by a cathode block and an optical coupling block, and the inorganic material segment may be an inner wall formed by the first encapsulation layer.

In an exemplary implementation mode, in the hole region inner wall of the edge region, the base segment may include an inner wall formed by a first flexible material layer, a first inorganic material layer, a second flexible material layer, and a second inorganic material layer, the organic material segment may be an inner wall formed by an optical coupling block, and the inorganic material segment may be an inner wall formed by a first encapsulation layer.

In the subsequent process, the display substrate can be peeled off from the glass substrate by a laser peeling process. In an exemplary embodiment of the present disclosure, an organic material is formed in the hole region, and a first encapsulation layer formed subsequently is formed on the organic material. In the process of etching to form the through hole, even though the first encapsulation layer at the bottom of the through hole is not completely etched off and part of the first encapsulation layer remains, the residual first encapsulation layer is disposed on the organic material, and because the adhesion between the organic material and the glass substrate is weak, the organic material is thus easily separated from the glass substrate during the laser peeling process, effectively avoiding the situation where the film layer cannot be peeled off during the peeling of the display substrate from the glass carrier plate.

In an exemplary implementation mode, during preparation for a flexible display substrate, a preparation process of the display substrate may include processes such as attaching of a back film, and cutting, which is not limited in the present disclosure.

In a display substrate provided with a stretch hole, there is not only a problem that the film layer cannot be effectively peeled off during the peeling process, but also a problem of encapsulation failure. It is found that, to a certain extent, the encapsulation failure is caused by peeling at the edge of the film layer in the partition structure, especially the peeling at the edge of the power supply line. Usually, the tensile deformation of the display substrate will subject the partition structure to a large tension force, and the tension force acting on the edge of the film layer will lead to peeling at the edge of the film layer and form a cavity at the edge of the film layer. When cracks appear in the encapsulation layer, external water and oxygen can enter the cavity through the cracks and flow along the channel formed by the cavity until they diffuse to the light emitting structure layer, resulting in encapsulation failure. Further study shows that the film layer could not be effectively peeled off during the peeling process, which, to a certain extent, was caused by a residual inorganic encapsulation layer in the stretch hole. In a current etching process of a hole region, it is difficult to completely etch away a structure layer in the hole region, especially a first encapsulation layer directly deposited on a glass base substrate in the edge region, so that a part of the first encapsulation layer attached to the glass base substrate will remain at a bottom of the hole region. When there is the part of the first encapsulation layer remaining at the bottom of the hole region, due to strong adhesion between the first encapsulation layer and the glass base substrate, a part of the first encapsulation layer cannot be separated from the glass base substrate during a peeling process, and the first encapsulation layer remaining on the glass base substrate will cause a pulling crack in an encapsulation layer, which will lead to encapsulation failure.

As can be seen from the structure of the display substrate and the preparation process thereof in the exemplary embodiment of the present disclosure, the exemplary embodiment of the present disclosure effectively avoids the peeling of the edge of the film layer, especially the peeling of the edge of the power supply line, by forming an edge multiple covering structure in the region where the edge of the power supply line is located. In an exemplary implementation mode of the present disclosure, the edge of the hole region and the first edge of the power supply line are covered by a partition layer, the partition layer is covered by an inorganic layer, the edge of the inorganic layer is covered by a connection electrode, the edge of the connection electrode is covered by a partition dam, the partition dam is covered by a cathode, so that the edge of the power supply line, the edge of the inorganic layer, the edge of the connection electrode and the partition dam are sequentially covered, the formed edge multiple covering structure can effectively avoid peeling failure of the edge of the power supply line, the edge of the inorganic layer and the edge of the connection electrode, the stretchable edge structure is stable and has good reliability, which avoids forming a water and oxygen transmission channel at the edge of the film layer and effectively ensures the encapsulation effect of the display substrate. In the exemplary embodiment of the present disclosure, an organic material is formed in the hole region, so that the first encapsulation layer formed subsequently is disposed on the organic material, and the organic material can be separated from the glass substrate without damage, which not only avoids the situation that the film layer of the display substrate cannot be separated from the glass substrate, but also avoids pulling cracks in the first encapsulation layer, thus effectively ensuring the encapsulation effect of the display substrate. The preparation process for the display substrate in the exemplary embodiment of the present disclosure has good process compatibility, simple process achievement, easy implementation, a high production efficiency, a low production cost, and a high yield.

Figure 17A:
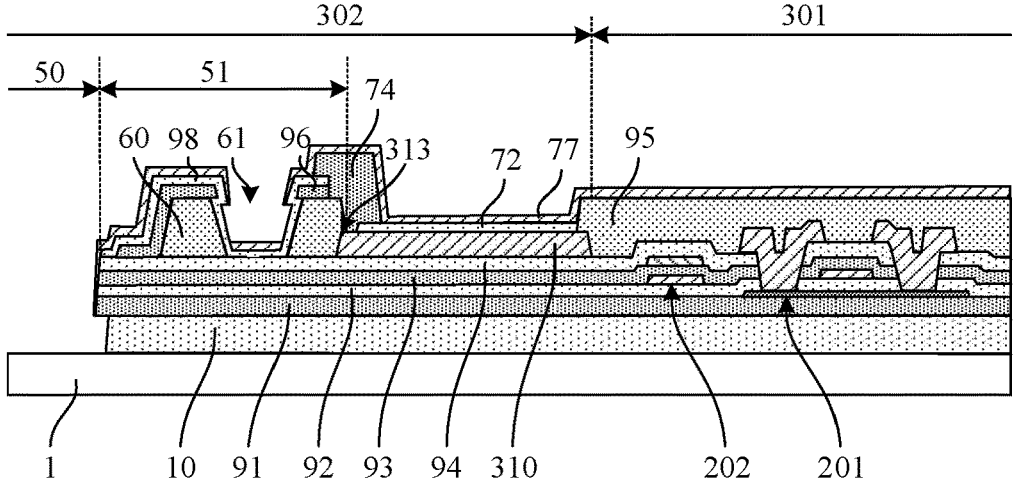
FIGS. 17a and 17b are schematic diagrams of a cross-sectional structure of another display substrate according to an embodiment of the present disclosure.
Figure 17B:
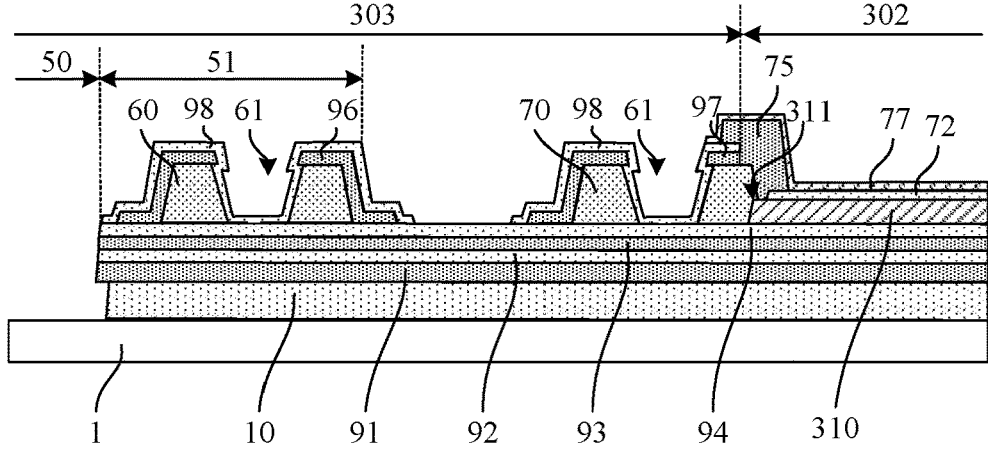

FIGS. 17a and 17b are schematic diagrams of a cross-sectional structure of another display substrate according to an exemplary embodiment of the present disclosure. FIG. 17a illustrates the cross-sectional structure at the interface between the circuit region 301 and the power supply line region 302 and is a cross-sectional view taken along a B-B direction in FIG. 6, and FIG. 17b illustrates the cross-sectional structure at the interface the power supply line region 302 and the edge region 303 and is a cross-sectional view taken along a C-C direction in FIG. 6. In an exemplary implementation mode, the film layer structure of the display region, the composite insulation layer of the power supply line region and the power supply line are substantially the same as in the aforementioned embodiments.

In an exemplary implementation mode, the first partition structure includes a first partition layer 60 surrounding the hole region 50, a first inorganic layer 96 disposed on the first partition layer 60, and a third inorganic layer 98 disposed on the first inorganic layer 96. A partition groove 61 surrounding the hole region 50 is provided on the first partition layer 60, and a partition hole surrounding the hole region 50 is provided on the first inorganic layer 96, and the partition hole and the partition groove communicate with each other. The first inorganic layer 96 located at the periphery of the partition hole has a protrusion with respect to the side wall of the partition groove 61, and the protrusion and the side wall of the partition groove form a recessed structure. The third inorganic layer 98 covers the first inorganic layer 96 and covers the inner wall of the partition groove 61.

In an exemplary implementation mode, the first partition layer 60 in the first partition structure covers the edge 313 of the hole region of the power supply line 310 on a side close to the hole region 50, and the first inorganic layer 96 and the third inorganic layer 98 in the first partition structure on a side away from the hole region 50 are not in direct contact with the power supply line 310, i.e., the orthographic projections of the first inorganic layer 96 and the third inorganic layer 98 on the base substrate do not overlap the orthographic projection of the power supply line 310 on the base substrate.

In an exemplary implementation mode, the side of the connection electrode 72 close to the hole region 50 is not in direct contact with the first inorganic layer 96 and the third inorganic layer 98 of the first partition structure on a side away from the hole region 50, and the orthographic projections of the first inorganic layer 96 and the third inorganic layer 98 on the base substrate do not overlap the orthographic projection of the connection electrode 72 on the base substrate.

In an exemplary implementation mode, the first partition dam 74 is disposed on a side of the first partition structure away from the hole region 50, the side of the first partition dam 74 close to the hole region 50 covers the edge of the first inorganic layer 96 and the third inorganic layer 98 on a side away from the hole region 50, and there is an overlapped region between the orthographic projections of the first inorganic layer 96 and the third inorganic layer 98 on the base substrate and the orthographic projection of the first partition dam 74 on the base substrate. The side of the first partition dam 74 away from the hole region 50 covers the edge of the connection electrode 72 on a side close to the hole region 50, and there is an overlapped region between the orthographic projection of the connection electrode 72 on the base substrate and the orthographic projection of the first partition dam 74 on the base substrate.

In an exemplary implementation mode, the second partition structure includes a second partition layer 70 extending along the first edge 311, a second inorganic layer 97 disposed on the second partition layer 70, and a third inorganic layer 98 disposed on the second inorganic layer 97, a partition groove 61 extending along the first edge 311 is provided on the second partition layer 70, and a partition hole extending along the first edge 311 is provided on the second inorganic layer 97, and the partition hole and the partition groove communicate with each other. The second inorganic layer 97 located at the periphery of the partition hole has a protrusion with respect to the side wall of the partition groove 61, and the protrusion and the side wall of the partition groove form a recessed structure. The third inorganic layer 98 covers the second inorganic layer 97 and covers the inner wall of the partition groove 61.

In an exemplary implementation mode, the second partition layer 70 in the second partition structure covers the first edge 311 of the power supply line 310, the second inorganic layer 97 in the second partition structure on a side close to the display region is not in direct contact with the power supply line 310, and the orthographic projections of the second inorganic layer 97 and the third inorganic layer 98 on the base substrate do not overlap the orthographic projection of the power supply line 310 on the base substrate.

In an exemplary implementation mode, the side of the connection electrode 72 close to the first edge 311 is not in direct contact with the second inorganic layer 97 and the third inorganic layer 98 of the second partition structure on a side close to the display region, and the orthographic projections of the second inorganic layer 97 and the third inorganic layer 98 on the base substrate do not overlap the orthographic projection of the connection electrode 72 on the base substrate.

In an exemplary implementation mode, the second partition dam 75 is disposed on a side of the second partition structure close to the display region, the side of the second partition dam away from the display region covers the edges of the second inorganic layer 97 and the third inorganic layer 98 on a side close to the display region, and there is an overlapped region between the orthographic projections of the second inorganic layer 97 and the third inorganic layer 98 on the base substrate and the orthographic projection of the second partition dam 75 on the base substrate. The side of the second partition dam 75 close to the display region covers the edge of the connection electrode 72 close to the first edge 311, and there is an overlapped region between the orthographic projection of the connection electrode 72 on the base substrate and the orthographic projection of the second partition dam 75 on the base substrate.

In an exemplary implementation mode, the cathode 77 covers the first partition dam 74 and second partition dam 75 i.e., the cathode 77 covers the entire exposed surface of the first partition dam 74 and second partition dam 75.

In an exemplary implementation mode, the first partition layer 60 and the second partition layer 70 may be disposed in the same layer as the planarization layer in the drive circuit layer, the first partition dam 74 and the second partition dam 75 may be disposed in the same layer as the pixel definition layer in the light emitting structure layer, the first inorganic layer and the second inorganic layer may be disposed in the same layer, and in the same layer as one insulation layer in the display region, and the third inorganic layer may be disposed in the same layer as another insulation layer in the display region.

In an exemplary implementation mode, the preparation process of another display substrate of the exemplary embodiment of the present disclosure may include the following operations.

The processes of (21) to (23) for preparing patterns of a base substrate, a drive structure layer, a partition layer, etc., are the same as those of the preparation processes (11) to (13) of the aforementioned embodiments.

Figure 18A:
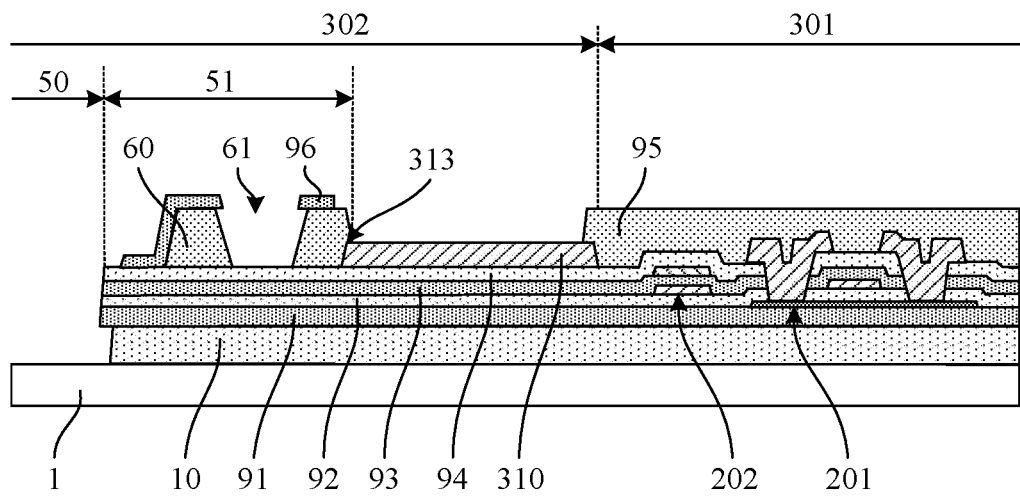
FIGS. 18a to 18b are schematic views after another pattern of a partition groove is formed in the present disclosure.
Figure 18B:
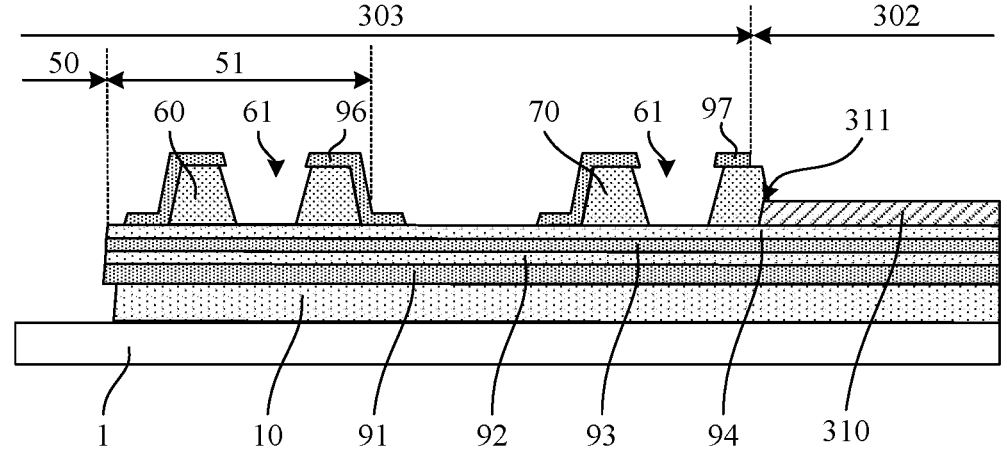

(24-1) Forming a pattern of a partition groove. In an exemplary implementation mode, forming the pattern of the partition groove may include: depositing an inorganic material film on the base substrate on which the aforementioned patterns, patterning the inorganic material film by a patterning process to form a first inorganic layer 96 covering a portion of the surface of the first partition layer 60, a second inorganic layer 97 covering a portion of the surface of the second partition layer 70, and a partition groove 61 provided on the first partition layer 60 and the second partition layer 70, as shown in FIGS. 18a and 18b, wherein FIG. 18a is a cross-sectional view taken along a B-B direction in FIG. 6 and FIG. 18b is a cross-sectional view taken along a C-C direction in FIG. 6.

In an exemplary implementation mode, for the first inorganic layer 96 of the first partition structure in the power supply line region 302, a side of the first inorganic layer 96 close to the hole region 50 covers a surface of the first partition layer 60 on a side close to the hole region the side of the first inorganic layer 96 away from the hole region 50 is on the surface of the first partition layer 60 on a side away from the base substrate, a portion of the surface of the first partition layer 60 on a side away from the hole region 50 is not covered by the first inorganic layer 96, so that the side of the first inorganic layer 96 away from the hole region 50 is not directly connected to the power supply line 310, and the orthographic projection of the first inorganic layer 96 on the base substrate and the orthographic projection of the power supply line 310 on the base substrate do not overlap.

In an exemplary implementation mode, for the second inorganic layer 97 of the second partition structure in the power supply line region 302, a side of the second inorganic layer 97 away from the display region covers a surface of the second partition layer 70 on a side away from the display region, the side of the second inorganic layer 97 close to the display region is located on a surface of the second partition layer 70 on a side away from the base substrate, a part of the surface of the second partition layer 70 on a side close to the display region is not covered by the second inorganic layer 97, so that the side of the second inorganic layer 97 close to the display region is not directly connected to the power supply line 310, and the orthographic projection of the second inorganic layer 97 on the base substrate and the orthographic projection of the power supply line 310 on the base substrate do not overlap.

In an exemplary implementation mode, for the first inorganic layer 96 of the first partition structure in the edge region 303, the first inorganic layer 96 covers the outer surface of the first partition layer 60.

In an exemplary implementation mode, the structure and process of forming a partition groove having a side erosion structure in the first partition structure and the second partition structure are similar to those of the foregoing exemplary embodiment.

Figure 19A:
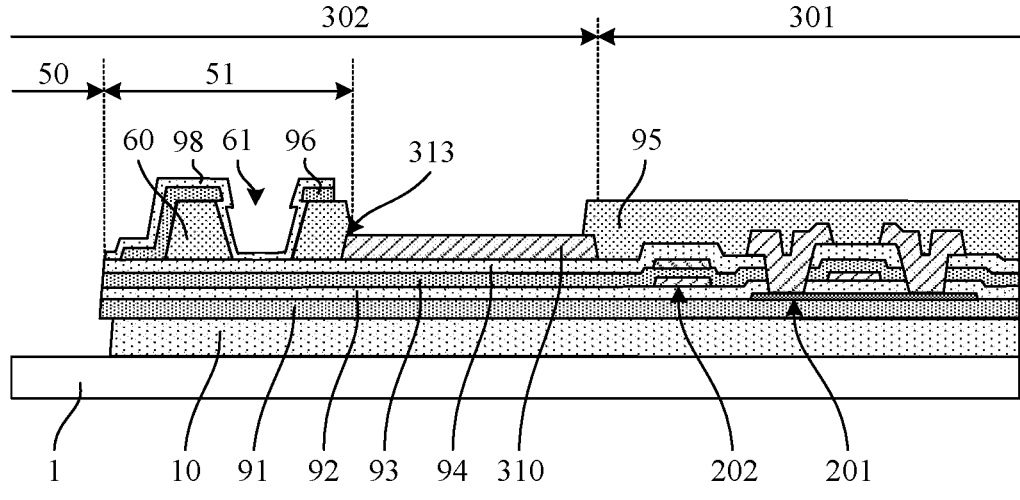
FIGS. 19a to 19b are schematic views after another pattern of a third inorganic layer is formed according to the present disclosure.
Figure 19B:
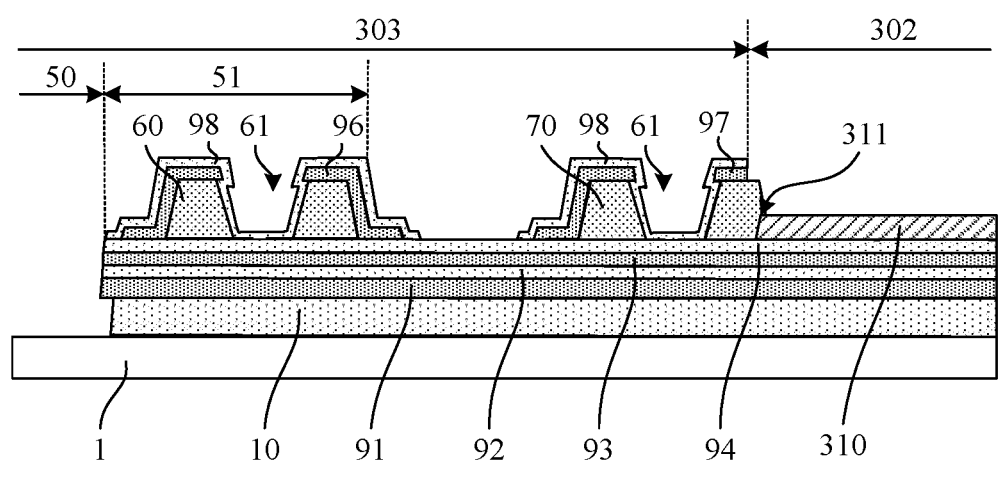

(24-2) Forming a pattern of a third inorganic layer. In an exemplary implementation mode, forming the pattern of the third inorganic layer may include depositing an inorganic material film on the base substrate on which the aforementioned patterns are formed, patterning the inorganic material film by a patterning process to form a pattern of a third inorganic layer 98, as shown in FIGS. 19a and 19b, wherein FIG. 19a is a cross-sectional view taken along a B-B direction in FIG. 6, and FIG. 19b is a cross-sectional view taken along a C-C direction in FIG. 6.

In an exemplary implementation mode, the third inorganic layer 98 is disposed on a side of the first inorganic layer 96 and the second inorganic layer 97 away from the base substrate, and covers the inner wall of the partition groove 61, herein covering the inner wall of the partition groove 61 includes covering the sidewall surface and the bottom surface of the partition groove 61. The third inorganic layer 98 completely covers the inner wall of the partition groove to ensure the integrity of the partition structure, which can ensure the partition effect of the partition structure.

In an exemplary implementation mode, for the third inorganic layer 98 of the first partition structure in the power supply line region 302, the side of the third inorganic layer 98 close to the hole region 50 covers the surface of the first inorganic layer 96 on a side close to the hole region 50, the side of the third inorganic layer 98 away from the hole region 50 is on the surface of the first inorganic layer 96 on a side away from the base substrate, the edge of the third inorganic layer 98 on a side away from the hole region 50 is substantially flush with the edge of the first inorganic layer 96 on a side away from the hole region 50, so that the side of the third inorganic layer 98 away from the hole region 50 is not directly connected to the power supply line 310, and the orthographic projections of the first inorganic layer 96 and the third inorganic layer 98 on the base substrate do not overlap the orthographic projection of the power supply line 310 on the base substrate.

In an exemplary implementation mode, for the third inorganic layer 98 of the second partition structure in the power supply line region 302, the side of the third inorganic layer 98 away from the display region covers the surface of the second inorganic layer 97 on a side away from the display region, the side of the third inorganic layer 98 close to the display region is located on the surface of the second inorganic layer 97 at a side away from the base substrate, and the edge of the third inorganic layer 98 on a side close to the display region is substantially flush with the edge of the second inorganic layer 97 on a side close to the display region, thus, the side of the third inorganic layer 98 close to the display region is not directly connected to the power supply line 310, and the orthographic projections of the second inorganic layer 97 and the third inorganic layer 98 on the base substrate and the orthographic projection of the power supply line 310 on the base substrate do not overlap.

In an exemplary implementation mode, a first partition layer 60 and a partition groove 61 provided on the first partition layer 60, a first inorganic layer 96 provided on the first partition layer 60 and a partition hole provided on the first inorganic layer 96, and a third inorganic layer 98 provided on the first inorganic layer 96 and covering the inner wall of the partition groove form a first partition structure, the first partition structure is formed in the partition region 51 surrounding the hole region 50 and is an annular partition structure surrounding the hole region 50.

In an exemplary implementation mode, a second partition layer 70 and a partition groove 61 provided on the second partition layer 70, a second inorganic layer 97 provided on the second partition layer 70 and a partition hole provided on the second inorganic layer 97, and a third inorganic layer 98 provided on the second inorganic layer 97 and covering the inner wall of the partition groove form a second partition structure, the second partition structure is formed on a side of the first edge 311 away from the display region and is a linear partition structure extending along the first edge 311.

Figure 20A:
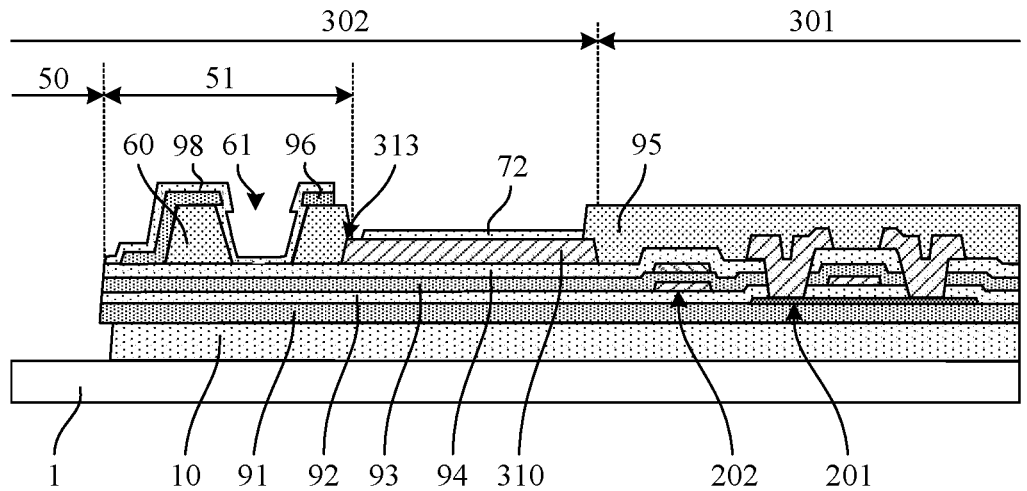
FIGS. 20a to 20b are schematic diagrams after another pattern of a connection electrode is formed according to the present disclosure.
Figure 20B:
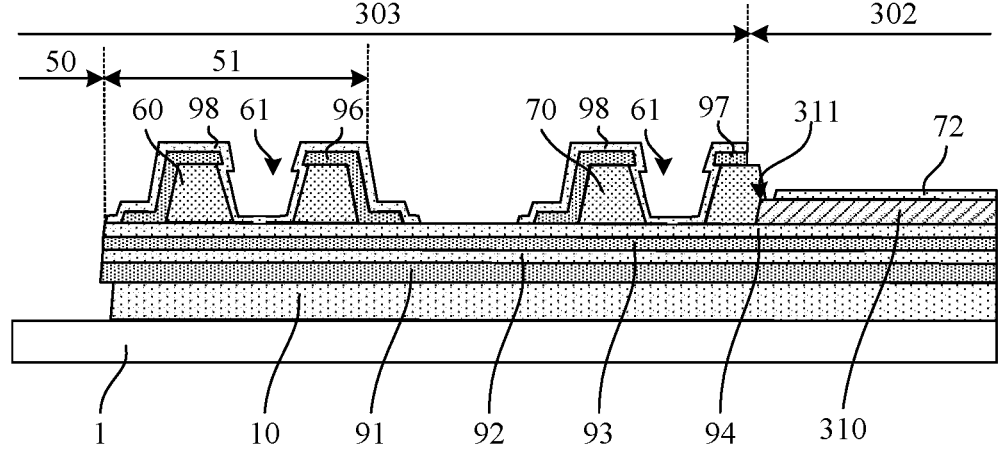

(25) Forming a pattern of a connection electrode. In an exemplary implementation mode, forming the pattern of the connection electrode may include depositing a conductive film on the base substrate on which the aforementioned patterns are formed, patterning the conductive film by a patterning process to form the pattern of the connection electrode, as shown in FIGS. 20a and 20b, wherein FIG. 20a is a cross-sectional view taken along a B-B direction in FIG. 6, and FIG. 20b is a cross-sectional view taken along a C-C direction in FIG. 6.

In an exemplary implementation mode, the connection electrode 72 is disposed on a side of the power supply line region 302 away from the base substrate, which enables connection between the connection electrode 72 and the power supply line 310.

In an exemplary implementation mode, the edge of the connection electrode 72 on a side close to the hole region 50 is spaced at a distance from the first partition structure, the connection electrode 72 is not in contact with each of the first partition layer 60, the first inorganic layer 96, and the third inorganic layer 98, and the orthographic projection of the connection electrode 72 on the base substrate does not overlap the orthographic projections of the first partition layer 60, the first inorganic layer 96, and the third inorganic layer 98 in the first partition structure on the base substrate.

In an exemplary implementation mode, the edge of the connection electrode 72 on a side away from the display region is spaced at a distance from the second partition structure, the connection electrode 72 is not in contact with each of the second partition layer 70, the second inorganic layer 97, and the third inorganic layer 98, and the orthographic projection of the connection electrode 72 on the base substrate does not overlap the orthographic projections of the second partition layer 70, the second inorganic layer 97, and the third inorganic layer 98 in the second partition structure on the base substrate.

Figure 21A:
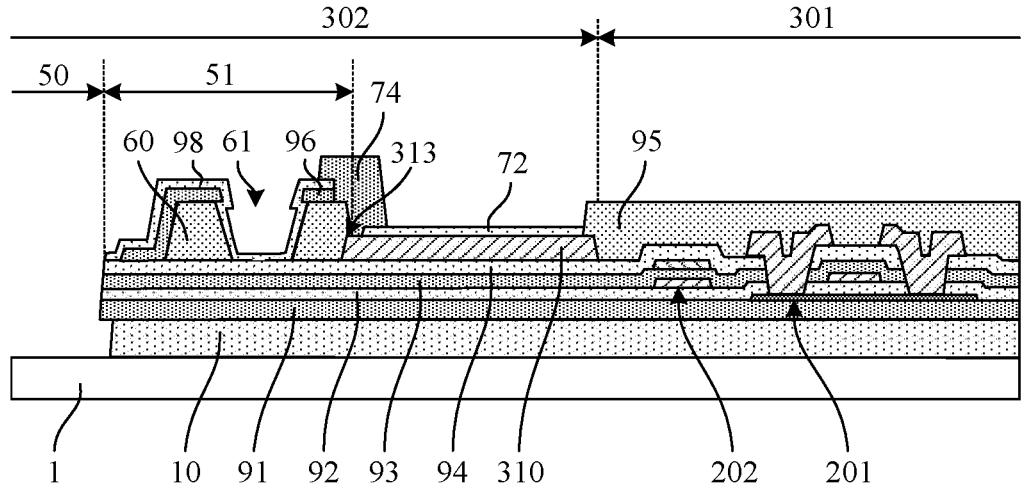
FIGS. 21a to 21b are schematic views after another pattern of a partition dam is formed according to the present disclosure.
Figure 21B:
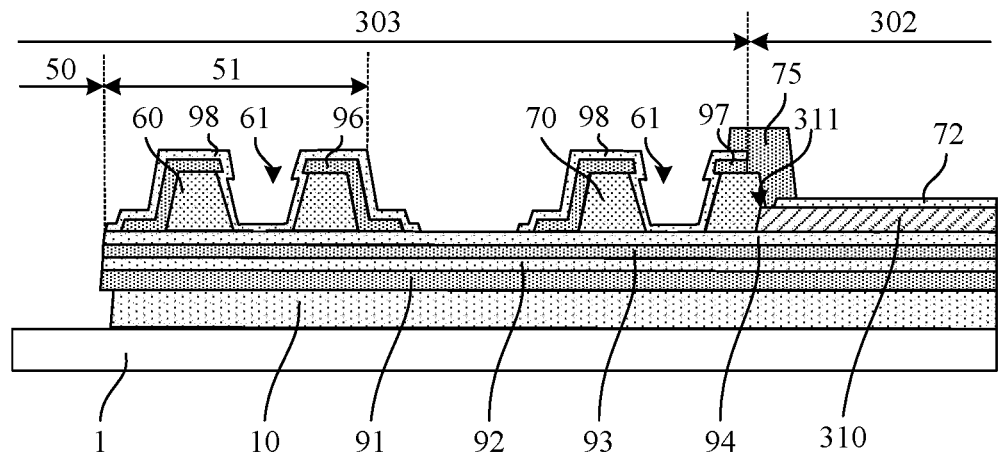

(26) Forming a pattern of a partition dam. In an exemplary implementation mode, forming a pattern of a partition dam may include: coating a pixel definition film on the base substrate on which the aforementioned patterns, patterning the pixel definition film by a patterning process to form a pattern of a first partition dam 74 and a second partition dam 75, as shown in FIGS. 21a and 21b, wherein FIG. 21a is a cross-sectional view taken along a B-B direction in FIG. 6, and FIG. 21b is a cross-sectional view taken along a C-C direction in FIG. 6.

In an exemplary implementation mode, the first partition dam 74 may be formed on the outer side of the first partition structure away from the hole region 50, as an annular dam body surrounding the first partition structure. The side of the first partition dam 74 close to the hole region 50 is disposed on the third inorganic layer 98 of the first partition structure on a side away from the hole region 50 and completely covers the edges of the first inorganic layer 96 and the third inorganic layer 98 on a side away from the hole region 50. The side of the first partition dam 74 away from the hole region 50 is provided on the connection electrode 72 and completely covers the edge of the connection electrode 72 on a side close to the hole region 50. In this way, the first partition dam 74 simultaneously covers the edge of the connection electrode 72 on a side close to the hole region, and the edges of the first inorganic layer 96 and the third inorganic layer 98 on a side away from the hole region. In an exemplary implementation mode, the orthographic projection of the edge of the connection electrode 72 on a side close to the hole region on the base substrate is within the range of the orthographic projection of the first partition dam

74 on the base substrate, and the orthographic projection of the edges of the first inorganic layer 96 and the third inorganic layer 98 on a side away from the hole region on the base substrate is within the range of the orthographic projection of the first partition dam 74 on the base substrate. Because the edge 313 of the hole region of the power supply line 310 is covered by the first partition layer 60, the edges of the first inorganic layer 96 and the third inorganic layer 98, and the edge of the connection electrode 72 are covered by the first partition dam 74, so that the edge of the hole region of the power supply line, the edges of the first inorganic layer and the third inorganic layer, and the edge of the connection electrode are covered, and the peeling failure of the edge of the hole region of the power supply line, the edges of the first inorganic layer and the third inorganic layer, and the edge of the connection electrode can be effectively prevented.

In an exemplary implementation mode, the second partition dam 75 may be formed on a side of the second partition structure close to the display region, as a linear dam body extending along the first edge 311. The side of the second partition dam 75 away from the display region is provided on the third inorganic layer 98 of the second partition structure on a side close to the display region, and completely covers the edges of the second inorganic layer 97 and the third inorganic layer 98 on a side close to the display region. The side of the second partition dam 75 close to the display region is provided on the connection electrode 72 and completely covers the edge of the connection electrode 72 on a side away from the display region. Thus the second partition dam 75 simultaneously covers the edge of the connection electrode 72 on a side away from the display region and the edges of the second inorganic layer 97 and the third inorganic layer 98 on a side close to the display region. In an exemplary implementation mode, the orthographic projection of the edge of the connection electrode 72 on a side away from the display region on the base substrate is within the range of the orthographic projection of the second partition dam 75 on the base substrate, and the orthographic projection of the edges of the second inorganic layer 97 and the third inorganic layer 98 on a side close to the display region on the base substrate is within the range of the orthographic projection of the second partition dam 75 on the base substrate. Because the first edge 311 of the power supply line 310 is covered by the second partition layer 70, the edges of the second inorganic layer 97 and the third inorganic layer 98 and the edge of the connection electrode 72 are covered by the second partition dam 75, so that the first edge of the power supply line, the edge of the second inorganic layer, the edge of the third inorganic layer and the edge of the connection electrode are sequentially covered, thereby peeling failure of the first edge of the power supply line, the edges of the second inorganic layer and the third inorganic layer and the edge of the connection electrode can be effectively prevented.

(27) to (30). Forming an organic light emitting layer, a cathode, an optical coupling layer, an encapsulating layer and a subsequent process thereof are the same as the preparation processes (17) to (20) of the aforementioned embodiments.

The exemplary embodiment of the present disclosure effectively avoids the peeling of the edge of the film layer, especially the peeling of the edge of the power supply line, by forming the cover structure of the partition dam in the region where the edge of the power supply line is located.

In an exemplary implementation mode of the present disclosure, the edge of the hole region and the first edge of the power supply line are covered by a partition layer, the edge of the inorganic layer and the edge of the connection electrode are covered by a partition dam, so that the peeling failure of the edge of the power supply line, the edge of the inorganic layer and the edge of the connection electrode can be effectively avoided, the stretchable edge structure is stable and has good reliability, the formation of a water and oxygen transmission channel at the edge of the film layer is avoided, and the encapsulation effect of the display substrate is effectively ensured. Moreover, by setting the inorganic layer not in contact with the power supply line and setting the inorganic layer not in contact with the connection electrode, the process difficulty can be reduced, and the material residue caused by the film layer segment difference can be reduced, which effectively ensures the process quality and improves a product yield. In addition, an organic material is formed in the hole region, so that the first encapsulation layer formed subsequently is disposed on the organic material, and the organic material can be separated from the glass substrate without damage, which not only avoids the situation that the film layer of the display substrate cannot be separated from the glass substrate, but also avoids pulling cracks in the first encapsulation layer, thus effectively ensuring the encapsulation effect of the display substrate. The preparation process of the display substrate in the exemplary embodiment of the present disclosure has good process compatibility, simple process achievement, easy implementation, a high production efficiency, a low production cost, and a high yield.

The structure of the display substrate and the preparation process thereof in the exemplary embodiments of the present disclosure are merely illustrative. In an exemplary implementation mode, a corresponding structure may be changed and a patterning process may be increased or decreased according to actual needs. For example, a plurality of sequentially sleeved first partition structures may be provided on an outside of the hole region. As another example, the side of the first edge away from the display region may be provided with a plurality of second partition structures disposed sequentially, which is not limited in the present disclosure.

The present disclosure further provides a display device including the display substrate of the aforementioned embodiments. The display device may be any product or component with a display function, such as a mobile phone, a tablet computer, a television, a display, a laptop computer, a digital photo frame, or a navigator.

Although the implementation modes disclosed in the present disclosure are as above, the described contents are only implementation modes used for convenience of understanding the present disclosure and are not intended to limit the present disclosure. Any skilled in the art to which the present disclosure pertains, without departing from the spirit and scope disclosed in the present disclosure, may make any modifications and changes in a form and details of implementation. However, the scope of patent protection of the present application should still be subject to the scope defined by the appended claims.

The invention claimed is:

1. A display substrate, comprising a display region and a bezel region located on at least one side of the display region, wherein the display region and the bezel region each comprises at least one hole; the hole comprises a hole region and a partition region surrounding the hole region, the partition region is provided with a first partition structure surrounding the hole region; the first partition structure comprises a first partition layer surrounding the hole region and a first cover layer provided on the first partition layer, a partition groove surrounding the hole region is provided on the first partition layer, a partition hole surrounding the hole region is provided on the first cover layer, the partition hole is communicated with the partition groove; the first cover layer located at a periphery of the partition hole comprises a protrusion relative to a side wall of the partition groove, and the protrusion and the side wall of the partition groove form a recessed structure, and wherein the bezel region comprises a circuit region, a power supply line region and an edge region provided sequentially along a direction away from the display region, the power supply line region comprises the at least one hole; in a direction perpendicular to a base substrate, the power supply line region comprises at least one insulation layer disposed on the base substrate and a power supply line disposed on the at least one insulation layer; the first partition layer in the first partition structure covers an edge of the hole region of the power supply line on a side close to the hole region.

2. The display substrate of claim 1, wherein the first cover layer is not in direct contact with the power supply line.

3. The display substrate of claim 1, wherein the first cover layer of the first partition structure on a side away from the hole region is lapped on the power supply line.

4. The display substrate of claim 1, wherein an orthographic projection of the power supply line on a plane where the display substrate is located and an orthographic projection of the first cover layer on the plane where the display substrate is located are at most partially overlapped.

5. The display substrate of claim 1, wherein in a direction parallel to the base substrate, a first edge and/or a second edge of the power supply line are bending lines, the first edge is an edge of the power supply line on a side away from the display region, and the second edge is an edge of the power supply line on a side close to the display region.

6. The display substrate of claim 5, wherein orthographic projections of the first edge and/or the second edge on a plane where the display substrate is located are not overlapped with an orthographic projection of the hole on the plane where the display substrate is located.

7. The display substrate of claim 5, wherein a second partition structure is provided on a side of the first edge away from the display region, the second partition structure comprises a second partition layer extending along the first edge and a second cover layer disposed on the second partition layer, a second partition groove extending along the first edge is provided on the second partition layer, and a second partition hole extending along the first edge is provided on the second cover layer, and the second partition hole is communicated with the second partition groove; the second cover layer located at a periphery of the second partition hole comprises another protrusion relative to a side wall of the second partition groove, and the other protrusion and the side wall of the second partition groove form a recessed structure.

8. The display substrate of claim 7, wherein the second partition layer in the second partition structure covers the first edge of the power supply line.

9. The display substrate of claim 7, wherein the second cover layer is not in direct contact with the power supply line.

10. The display substrate of claim 7, wherein the second cover layer of the second partition structure on a side close to the display region is lapped on the power supply line.

11. The display substrate of claim 7, wherein the power supply line region further comprises a second partition dam extending along the first edge, the second partition dam is disposed on a side of the second partition structure close to the display region, a side of the second partition dam away from the display region is disposed on the second cover layer, and a side of the second partition dam close to the display region covers an edge of the connection electrode on a side close to the first edge.

12. The display substrate of claim 1, wherein the power supply line region further comprises a connection electrode and a first partition dam surrounding the hole region, the connection electrode is disposed on the power supply line, the first partition dam is disposed on a side of the first partition structure away from the hole region, and a side of the first partition dam away from the hole region covers an edge of the connection electrode on a side close to the hole region.

13. The display substrate of claim 1, wherein the power supply line region further comprises a connection electrode and a second partition dam extending along the first edge, the second partition dam is disposed on a side of the second partition structure close to the display region, and the side of the second partition dam close to the display region covers an edge of the connection electrode on a side close to the first edge.

14. The display substrate of claim 1, further comprising a third cover layer disposed on the first cover layer and/or the second cover layer, the third cover layer covers at least the first cover layer and/or the second cover layer, and the partition groove.

15. The display substrate of claim 14, wherein an edge of the first cover layer away from the hole region and an edge of the third cover layer away from the hole region are substantially flush; and/or an edge of the second cover layer away from the hole region and the edge of the third cover layer away from the hole region are substantially flush.

16. The display substrate of claim 1, wherein the power supply line region further comprises a connection electrode, the connection electrode is provided on the power supply line, a side of the connection electrode close to the hole region covers an edge of the first cover layer being lapped on the power supply line, and a side of the connection electrode close to the first edge covers the edge of the first cover layer being lapped on the power supply line.

17. The display substrate of claim 16, wherein the power supply line region further comprises a first partition dam surrounding the hole region, the first partition dam is disposed on a side of the first partition structure away from the hole region, a side of the first partition dam close to the hole region is disposed on the first cover layer, and a side of the first partition dam away from the hole region covers an edge of the connection electrode on a side close to the hole region.

18. The display substrate of claim 17, wherein an orthographic projection of the edge of the connection electrode on the side close to the hole region on a plane where the display substrate is located is within a range of an orthographic projection of the first partition dam on the plane where the display substrate is located, and/or, an orthographic projection of an edge of the first cover layer on a side away from the hole region on the plane where the display substrate is located is within the range of the orthographic projection of the first partition dam on the plane where the display substrate is located.

19. A display device, comprising the display substrate of claim 1.

* * * * *